US012581600B2

(12) United States Patent
Zhang et al.

(10) Patent No.: US 12,581,600 B2
(45) Date of Patent: Mar. 17, 2026

(54) GENERATION OF RANDOM SECURITY CIRCUIT PATTERNS FOR IN-SITU FABRICATION OF TAMPER-RESPONDENT SENSORS

(71) Applicant: INTERNATIONAL BUSINESS MACHINES CORPORATION, Armonk, NY (US)

(72) Inventors: Hongqing Zhang, Hopewell Junction, NY (US); Arthur J. Higby, Cottekill, NY (US); David J. Lewison, LaGrangeville, NY (US); James Busby, New Paltz, NY (US); Jay A. Bunt, Esopus, NY (US); Levi Campbell, Poughkeepsie, NY (US); Philipp K. Buchling Rego, Wappingers Falls, NY (US); Shidong Li, Hopewell Junction, NY (US); Sylvain Tetreault, Granby (CA); Yu Luo, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 452 days.

(21) Appl. No.: 18/463,397

(22) Filed: Sep. 8, 2023

(65) Prior Publication Data

US 2025/0089174 A1     Mar. 13, 2025

(51) Int. Cl.
*H05K 3/02*          (2006.01)
*G05B 19/40*       (2006.01)
(Continued)

(52) U.S. Cl.
CPC ....... *H05K 3/0005* (2013.01); *G05B 19/4097* (2013.01); *H05K 1/0275* (2013.01);
(Continued)

(58) Field of Classification Search
None
See application file for complete search history.

(56) References Cited

U.S. PATENT DOCUMENTS 5,369,299 A * 11/1994 Byrne ................... H01L 23/573
                                                                       257/769
6,268,567 B1     7/2001 Brodsky et al.
(Continued)

FOREIGN PATENT DOCUMENTS

AU          2002326226 B2     6/2008
BR             0212873 A       9/2004
(Continued)

OTHER PUBLICATIONS

Garb et al., "FORTRESS: FORtified Tamper-Resistant Envelope with Embedded Security Sensor", 2021, 18th International Conference on Privacy, Security and Trust (PST). (Year: 2021).*
(Continued)

*Primary Examiner* — Mohammad Ali
*Assistant Examiner* — Kelvin Booker
(74) *Attorney, Agent, or Firm* — Tihon Poltavets, Esq; Kevin P. Radigan, Esq.; Heslin Rothenberg Farley & Mesiti P.C

(57)          ABSTRACT
In-situ fabrication of tamper-respondent sensors with random security circuit patterns is provided. The method includes establishing a random security circuit pattern for fabricating a security circuit of a tamper-respondent sensor to enclose, at least in part, one or more components within a secure volume. The establishing includes generating a trace pattern extending once through nodes of a plurality of nodes dispersed within an area of the tamper-respondent sensor, and randomly modifying the trace pattern to produce a randomly modified trace pattern with a desired randomization index relative to a specified randomization threshold, and providing the randomly modified trace pattern as a
(Continued)

random security circuit pattern. Further, the method includes initiating fabricating of the tamper-respondent sensor in-situ on a surface of an enclosure to facilitate defining the secure volume, with the fabricating using the random security circuit pattern.

20 Claims, 23 Drawing Sheets

(51) Int. Cl.

| | | |
|---|---|---|
| G05B 19/4097 | (2006.01) | |
| H05K 1/02 | (2006.01) | |
| H05K 3/00 | (2006.01) | |
| H05K 3/10 | (2006.01) | |
| H05K 3/18 | (2006.01) | |
| H05K 3/46 | (2006.01) | |

(52) U.S. Cl.
CPC .............. *H05K 3/02* (2013.01); *H05K 3/108* (2013.01); *H05K 3/18* (2013.01); *H05K 3/4644* (2013.01); *G05B 2219/35012* (2013.01); *H05K 2201/0999* (2013.01); *H05K 2203/107* (2013.01)

(56) References Cited

U.S. PATENT DOCUMENTS

| | | | |
|---|---|---|---|
| 7,434,069 B2 | 10/2008 | Nessler | |
| 7,760,086 B2 | 7/2010 | Hunter et al. | |
| 7,787,256 B2 | 8/2010 | Chan et al. | |
| 8,325,486 B2 | 12/2012 | Arshad et al. | |
| 8,589,703 B2 | 11/2013 | Lee | |
| 9,521,764 B2 | 12/2016 | Steiner | |
| 9,999,124 B2* | 6/2018 | Busby | .................... G01N 27/20 |
| 10,168,185 B2* | 1/2019 | Brodsky | .................. G01D 5/16 |
| 10,299,372 B2* | 5/2019 | Dragone | ............. H05K 1/0272 |
| 10,306,753 B1* | 5/2019 | Fadden | ................. H01L 23/576 |
| 10,321,589 B2 | 6/2019 | Dragone et al. | |
| 10,327,329 B2 | 6/2019 | Brodsky et al. | |
| 10,331,915 B2* | 6/2019 | Brodsky | ............. H05K 1/0275 |
| 10,388,127 B2 | 8/2019 | Dragone et al. | |
| 10,595,401 B1* | 3/2020 | Busby | ................. H05K 3/4644 |
| 11,481,521 B2 | 10/2022 | Soffer | |
| 2001/0020541 A1 | 9/2001 | Brodsky et al. | |
| 2003/0070083 A1 | 4/2003 | Nessler | |
| 2010/0017621 A1* | 1/2010 | Crawford | ............... G06F 21/72 |
| | | | 713/189 |

| | | | |
|---|---|---|---|
| 2017/0094808 A1* | 3/2017 | Brodsky | .............. H05K 1/0275 |
| 2018/0092203 A1* | 3/2018 | Dragone | ................ H05K 1/185 |
| 2018/0092204 A1* | 3/2018 | Dragone | ................. G06F 21/87 |
| 2018/0096173 A1* | 4/2018 | Brodsky | .............. H05K 1/0275 |
| 2018/0124915 A1* | 5/2018 | Busby | ..................... G06F 21/86 |
| 2018/0358311 A1* | 12/2018 | Busby et al. | .......... H01L 24/83 |
| 2019/0037686 A1* | 1/2019 | Busby | ................... H05K 1/115 |
| 2019/0037687 A1* | 1/2019 | Busby | ................. H05K 1/0275 |
| 2019/0220628 A1* | 7/2019 | Brodsky | ................. H05K 5/03 |
| 2019/0261506 A1* | 8/2019 | Fadden | ............... H05K 5/0208 |
| 2019/0387617 A1 | 12/2019 | Dragone et al. | |
| 2020/0008295 A1* | 1/2020 | Fadden | .................. G06F 21/00 |
| 2020/0045812 A1* | 2/2020 | Busby | ................. H05K 1/0275 |
| 2020/0074120 A1* | 3/2020 | Meiler | ................... G06F 21/71 |
| 2020/0285778 A1 | 9/2020 | Soffer | |
| 2023/0068967 A1* | 3/2023 | Werner | ............... H05K 1/0275 |

FOREIGN PATENT DOCUMENTS

| | | | | |
|---|---|---|---|---|
| CA | 2461408 C | 6/2012 | | |
| CA | 2798626 A1 | 6/2014 | | |
| DE | 102012109665 A1 * | 4/2013 | ............ | G06F 21/76 |
| EP | 717379 A2 | 6/1996 | | |
| EP | 1442349 A1 | 8/2004 | | |
| EP | 3710975 A1 | 9/2020 | | |
| GB | 2330439 A | 4/1999 | | |
| HK | 1075945 A1 | 1/2011 | | |
| IL | 161027 A | 8/2004 | | |
| IL | 274589 A | 6/2020 | | |
| IN | 363 | 3/2006 | | |
| IN | 242626 A1 | 9/2010 | | |
| NO | 20041110 L | 6/2004 | | |
| NO | 331504 B1 | 1/2012 | | |
| WO | WO 2003/027816 A1 | 4/2003 | | |
| WO | WO 2019/092729 A1 | 5/2019 | | |
| ZA | 200402355 B | 6/2005 | | |

OTHER PUBLICATIONS

Dupont et al., "A Miniaturized and Ultra-Low-Power Tamper Detection Sensor for Portable Applications", Oct. 2021, IEEE Sensors Journal, vol. 22, No. 5. (Year: 2021).*

Halit et al., "Fringe-Effect Capacitive Proximity Sensors for Tamper Proof Enclosures", SIcon/05—Sensors for Industry Conference, https://www.researchgate.net/publication/224677459 (6 pages) (Year: 2005).

Oberdorf et al., "Secondary Structures in Long Compact Polymers", arXiv:cond-mat/0508094v1, published Aug. 3, 2005 (14 pages) (Year: 2005).

* cited by examiner

1000

1001

1002

ENUMERATION OF POSSIBLE
TRACE TYPES IN 3x3 SUB-BLOCK

1700

1900

GENERATION OF RANDOM SECURITY CIRCUIT PATTERNS FOR IN-SITU FABRICATION OF TAMPER-RESPONDENT SENSORS

BACKGROUND

The present disclosure relates in general to the field of electronics, and more particularly, to tamper-proof electronic packaging.

Many activities require secure electronic communications. To facilitate secure electronic communications, an encryption/decryption system can be implemented on an electronic assembly or circuit board assembly that is included in equipment connected to a communications network. Such an electronic assembly is an enticing target for malefactors since it may contain codes or keys to decrypt intercepted messages, or to encode fraudulent messages. To prevent this, the electronic assembly can be mounted in an enclosure, which is then wrapped in a security sensor and encapsulated with polyurethane resin. The security sensor can be, in one or more embodiments, a web or sheet of insulating material with circuit elements, such as closely-spaced, conductive lines fabricated on it. The circuit elements are disrupted if the sensor is torn during a tamper event, with the tear being sensed by a monitor circuit to reveal the attack on the integrity of the assembly, triggering an erasure by the monitor circuit of encryption/decryption keys stored within the electronic assembly.

SUMMARY

Certain shortcomings of the prior art are overcome, and additional advantages are provided herein through the provision, in one or more aspects, of a method which includes establishing a random security circuit pattern for fabricating a security circuit of a tamper-respondent sensor to enclose, at least in part, one or more components within a secure volume. The establishing includes generating a trace pattern extending once through nodes of a plurality of nodes dispersed within an area of the tamper-respondent sensor, and randomly modifying the trace pattern to produce a randomly modified trace pattern with a desired randomization index relative to a specified randomization threshold, and providing the randomly modified trace pattern as the random security circuit pattern. In addition, the method includes initiating fabricating of the tamper-respondent sensor in-situ on a surface of an enclosure to facilitate defining the secure volume, where the fabricating uses the random security circuit pattern. Advantageously, the method enhances security of the secure volume by randomly modifying the trace pattern to produce the randomly modified trace pattern with the desired randomization index relative to the specified randomization threshold. Further, in-situ fabrication of the tamper-respondent sensor on the surface of the enclosure avoids need for adhesive to assemble the tamper-respondent sensor onto the enclosure, and eliminates the possibility of a cavity being induced within the adhesive. Further, yield is improved by in-situ-forming of the tamper-respondent sensor on the surface of the enclosure, eliminating any need to physically handle the tamper-respondent sensor during assembly.

In an embodiment, the security circuit is a multilayer security circuit, and the random security circuit pattern is used in fabricating one layer of the multilayer security circuit, and the method further includes establishing a respective random security circuit pattern for each layer of multiple layers of the multilayer security circuit, and the initiating fabricating includes initiating in-situ fabricating of the multilayer security circuit using the respective random security circuit patterns for the multiple layers of the multilayer security circuit. Advantageously, in-situ fabricating of the multilayer security circuit using respective random security circuit patterns for the multiple layers of the multilayer security circuit enhances security by making the tamper-respondent sensor less susceptible to reverse engineering or intrusion through the enhanced number of security circuit layers and enhanced randomization of each security circuit layer.

In an embodiment, the initiating fabricating includes initiating direct plating of the multilayer security circuit on the surface of the enclosure using the respective random security circuit patterns for the multiple layers of the multilayer security circuit. Advantageously, direct-plating of the multilayer security circuit on the surface of the enclosure enhances fabrication yield and makes the use of finer pitch security circuit traces practical.

In an embodiment, the surface of the enclosure includes a curved surface, and the direct plating includes laser-patterning in fabricating the multilayer security circuit on the surface of the enclosure using the respective random security circuit patterns. Advantageously, direct-plating of the multilayer security circuit on the surface of the enclosure, using the respective random security circuit patterns and laser-patterning, provides enhanced fabrication yield, particularly on the curved surface. Fabrication yield is improved over an approach where the tamper-respondent sensor is separately formed from the enclosure and adhesively attached to the surface of the enclosure, where the surface includes a curved surface.

In an embodiment, the trace pattern extends once through each node of the plurality of nodes between an input node and an output node, and the randomly modifying includes randomly modifying the trace pattern while ensuring that the randomly modified trace pattern extends once through the nodes of the plurality of nodes between the input and output nodes, and includes continuing to randomly modify the randomly modified trace pattern until the desired randomization index relative to the specified randomization threshold is reached. Continuing to randomly modify the randomly modified trace pattern until the desired randomization index relative to the specified randomization threshold is reached ensures a consistent level of randomization for improved security of the secure volume.

In an embodiment, generating the trace pattern includes dispersing the plurality of nodes uniformly within the area of the tamper-respondent sensor, determining an input node and an output node of the plurality of nodes, and creating the trace pattern extending once through the nodes of the plurality of nodes dispersed uniformly within the area of the tamper-respondent sensor between the input and output nodes. Advantageously, creating the trace pattern extending once through the plurality of nodes within the area, or area size, facilitates establishing the random security circuit pattern as noted for in-situ formation of the tamper-respondent sensor on the surface of the enclosure.

In an embodiment, creating the trace pattern extending once through the plurality of nodes within the area includes creating the trace pattern as a serpentine trace pattern extending through the plurality of nodes within the area using a self-avoiding walk sequence. Advantageously, creating the trace pattern as a serpentine trace pattern through the plurality of nodes within the area size using the self-avoiding walk sequence, and randomly modifying the trace pattern to produce the randomly modified trace pattern with the desired randomization index relative to the specified randomization threshold, enhances security by ensuring provision of a highly randomized security circuit pattern for in-situ formation of the tamper-respondent sensor on the surface of the enclosure.

In an embodiment, the method further includes determining the randomization index for the randomly modified trace pattern, where determining the randomization index includes determining, for each of i×i sub-block sizes, a number $N_i$ of different sub-block trace types within the randomly modified trace pattern extending through the plurality of nodes dispersed within the area, where i≥2. In addition, in one embodiment, determining the randomization index further includes determining, for each of the i×i sub-block sizes, a maximum possible number $P_i$ of different sub-block trace types within the randomly modified trace pattern extending through the plurality of nodes dispersed within the area. Further, in an embodiment, determining the randomization index includes ascertaining an entropy value for the randomly modified trace pattern using the number $N_i$ of different sub-block trace types within the randomly modified trace pattern, and the maximum possible number $P_i$ of different sub-block types within the randomly modified trace pattern, where the randomization index includes the entropy value. Advantageously, determining the randomization index for the randomly modified trace pattern relative to the specified randomization threshold based on entropy value ensures that the desired level of randomization is achieved during the randomly modifying of the trace pattern, thus ensuring consistency in providing a desired level of randomization to the random security circuit pattern being fabricated in-situ on the surface of the enclosure.

In an embodiment, ascertaining the entropy value includes determining:

$$S=\Sigma_{i=2}{}^n N_i/\Sigma_{i=2}{}^n P_i$$

where: S=the entropy value; i=a size of the i×i sub-block; $N_i$=number of different sub-block trace types within an i×i sub-block of the randomly modified trace pattern extending through the plurality of nodes dispersed within the specified area; and $P_i$=maximum possible number of different sub-block types within an i×i sub-block of the randomly modified trace pattern extending through the plurality of nodes dispersed within the specified area. Advantageously, ascertaining the entropy value as specified facilitates ensuring that the randomly modifying of the trace pattern produces the randomly modified trace pattern with the desired randomization index relative to the specified randomization threshold, thereby ensuring a desired level of randomization for enhanced security of the secure volume with in-situ fabrication of the tamper-respondent sensor on the surface of the enclosure using the random security circuit pattern.

In an embodiment, randomly modifying the trace pattern to produce the randomly modified trace pattern includes randomly opening a pair of adjacent trace segments of the trace pattern to produce a trace sub-chain unconnected to one of the input and output nodes, and randomly opening another pair of adjacent trace segments of the random pattern, where the other pair of adjacent trace segments includes a trace segment of the trace sub-chain. In addition, in an embodiment, randomly modifying the trace pattern includes reconnecting the trace sub-chain by adding trace segments connecting the open pair of adjacent trace segments, and adding trace segments connecting the other open pair of trace segments, to facilitate forming the randomly modified trace pattern. Advantageously, randomly modifying the trace pattern as noted to produce the randomly modified trace pattern enhances security of the secure volume by providing greater randomization to the process of establishing the random security circuitry pattern for fabricating the security circuit of the tamper-respondent sensor.

In accordance with one or more aspects, the embodiments are separable and optional from one another. Further, the above-noted embodiments can be combined with one another.

In another aspect, a computer system including a memory, and at least one processor in communication with the memory, is provided. The computer system is configured to perform a method, which includes establishing a random security circuit pattern for fabricating a security circuit of a tamper-respondent sensor to enclose, at least in part, one or more components within a secure volume. The establishing includes generating a trace pattern extending through nodes of the plurality of nodes dispersed within an area of the tamper-respondent sensor, and randomly modifying the trace pattern to produce a randomly modified trace pattern with a desired randomization index relative to a specified randomization threshold, and providing the randomly modified trace pattern as the random security circuit pattern. In addition, the method includes initiating fabricating of the tamper-respondent sensor in-situ on a surface of an enclosure to facilitate defining the secure volume, where fabricating uses the random security circuit pattern. Advantageously, the method enhances security of the secure volume by randomly modifying the trace pattern to produce the randomly modified trace pattern with the desired randomization index relative to the specified randomization threshold. Further, in-situ fabrication of the tamper-respondent sensor on the surface of the enclosure avoids need for adhesive to assemble the tamper-respondent sensor onto the enclosure, and eliminates the possibility of a cavity being induced within the adhesive. Further, yield is improved by in-situ-forming of the tamper-respondent sensor on the surface of the enclosure, eliminating any need to physically handle the tamper-respondent sensor during assembly.

In an embodiment of the computer system, the security circuit is a multilayer security circuit, and the random security circuitry pattern is used in fabricating one layer of the multilayer security circuit. In addition, the method further includes establishing a respective random security circuit pattern for each layer of multiple layers of the multilayer security circuit, and the initiating fabricating includes initiating in-situ fabricating of the multilayer security circuit using the respective random security circuit patterns for the multiple layers of the multilayer security circuit. Advantageously, in-situ fabricating of the multilayer security circuit using respective random security circuit patterns for the multiple layers of the multilayer security circuit enhances security by making the tamper-respondent sensor less susceptible to reverse engineering or intrusion through the enhanced number of security circuit layers and enhanced randomization of each security circuit layer.

In an embodiment of the computer system, the trace pattern extends once through each node of the plurality of nodes between an input node and an output node, and the randomly modifying includes randomly modifying the trace pattern while ensuring that the randomly modified trace pattern extends once through the nodes of the plurality of nodes between the input and output nodes, and includes continuing to randomly modify the randomly modified trace pattern until the desired randomization index relative to the specified randomization threshold is reached. Continuing to randomly modify the randomly modified trace pattern until the desired randomization index relative to the specified randomization threshold is reached ensures a consistent level of randomization for improved security of the secure volume.

In an embodiment of the computer system, generating the trace pattern includes dispersing the plurality of nodes uniformly within the area of the tamper-respondent sensor, determining an input node and an output node of the plurality of nodes, and creating the trace pattern extending once through the nodes of the plurality of nodes dispersed uniformly within the area of the tamper-respondent sensor between the input and output nodes. Advantageously, creating the trace pattern extending once through the plurality of nodes within the area size facilitates establishing the random security circuit pattern as noted for in-situ formation of the tamper-respondent sensor on the surface of the enclosure.

In an embodiment of the computer system, the method further includes determining the randomization index for the randomly modified trace pattern, where determining the randomization index includes determining, for each of $i \times i$ sub-block sizes, a number $N_i$ of different sub-block trace types within the randomly modified trace pattern extending through the plurality of nodes dispersed within the area, where $i \geq 2$. In addition, in one embodiment, determining the randomization index further includes determining, for each of the $i \times i$ sub-block sizes, a maximum possible number $P_i$ of different sub-block trace types within the randomly modified trace pattern extending through the plurality of nodes dispersed within the area. Further, in an embodiment, determining the randomization index includes ascertaining an entropy value for the randomly modified trace pattern using the number $N_i$ of different sub-block trace types within the randomly modified trace pattern, and the maximum possible number $P_i$ of different sub-block types within the randomly modified trace pattern, where the randomization index includes the entropy value. Advantageously, determining the randomization index for the randomly modified trace pattern relative to the specified randomization threshold based on an entropy value ensures that the desired level of randomization is achieved during the randomly modifying of the trace pattern, thus ensuring consistency in providing a desired level of randomization to the random security circuit pattern being fabricated in-situ on the surface of the enclosure.

In an embodiment of the computer system, randomly modifying the trace pattern to produce the randomly modified trace pattern includes randomly opening a pair of adjacent trace segments of the trace pattern to produce a trace sub-chain unconnected to one of the input and output nodes, and randomly opening another pair of adjacent trace segments of the random pattern, where the other pair of adjacent trace segments includes a trace segment of the trace sub-chain. In addition, in an embodiment, randomly modifying the trace pattern includes reconnecting the trace sub-chain by adding trace segments connecting the open pair of adjacent trace segments, and adding trace segments connecting the other open pair of trace segments, to facilitate forming the randomly modified trace pattern. Advantageously, randomly modifying the trace pattern as noted to produce the randomly modified trace pattern enhances security of the secure volume by providing greater randomization to the process of establishing the random security circuitry pattern for fabricating the security circuit of the tamper-respondent sensor.

In a further aspect, a computer program product is provided which includes one or more computer-readable stor-age media and program instructions collectively stored on the one or more computer-readable storage media readable by at least one processor to establish a random security circuit pattern for fabricating a security circuit of a tamper-respondent sensor to enclose, at least in part, one or more components within a secure volume. The establishing includes generating a trace pattern extending once through each node of a plurality of nodes dispersed within an area of the tamper-respondent sensor, and randomly modifying the trace pattern to produce a randomly modified trace pattern with a desired randomization index relative to a specified randomization threshold, and providing the randomly modified trace pattern as the random security circuit pattern. The program instructions are further readable by the at least one processor to initiate fabricating of the tamper-respondent sensor in-situ on a surface of an enclosure to facilitate defining the secure volume, where the fabricating uses the random security circuit pattern. Advantageously, the method enhances security of the secure volume by randomly modifying the trace pattern to produce the randomly modified trace pattern with the desired randomization index relative to the specified randomization threshold. Further, in-situ fabrication of the tamper-respondent sensor on the surface of the enclosure avoids need for adhesive to assemble the tamper-respondent sensor onto the enclosure, and eliminates the possibility of a cavity being induced within the adhesive. Further, yield is improved by in-situ-forming of the tamper-respondent sensor on the surface of the enclosure, eliminating any need to physically handle the tamper-respondent sensor during assembly.

In an embodiment of the computer program product, generating the trace pattern includes dispersing the plurality of nodes uniformly within the area of the tamper-respondent sensor, determining an input node and an output node of the plurality of nodes, and creating the trace pattern extending once through the nodes of the plurality of nodes dispersed uniformly within the area of the tamper-respondent sensor between the input and output nodes. Advantageously, creating the trace pattern extending once through the plurality of nodes within the area of the tamper-respondent sensor facilitates establishing the random security circuit pattern as noted for in-situ formation of the tamper-respondent sensor on the surface of the enclosure.

In an embodiment of the computer program product, the method further includes determining the randomization index for the randomly modified trace pattern, where determining the randomization index includes determining, for each of $i \times i$ sub-block sizes, a number $N_i$ of different sub-block trace types within the randomly modified trace pattern extending through the plurality of nodes dispersed within the area, where $i \geq 2$. In addition, in one embodiment, determining the randomization index further includes determining, for each of the $i \times i$ sub-block sizes, a maximum possible number $P_i$ of different sub-block trace types within the randomly modified trace pattern extending through the plurality of nodes dispersed within the area. Further, in an embodiment, determining the randomization index includes ascertaining an entropy value for the randomly modified trace pattern using the number $N_i$ of different sub-block trace types within the randomly modified trace pattern, and the maximum possible number $P_i$ of different sub-block types within the randomly modified trace pattern, where the randomization index includes the entropy value. Advantageously, determining the randomization index for the randomly modified trace pattern relative to the specified randomization threshold based on entropy value ensures that the desired level of randomization is achieved during the randomly modifying of the trace pattern, thus ensuring consistency in providing a desired level of randomization to the random security circuit pattern being fabricated in-situ on the surface of the enclosure.

In an embodiment of the computer program product, randomly modifying the trace pattern to produce the randomly modified trace pattern includes randomly opening a pair of adjacent trace segments of the trace pattern to produce a trace sub-chain unconnected to one of the input and output nodes, and randomly opening another pair of adjacent trace segments of the random pattern, where the other pair of adjacent trace segments includes a trace segment of the trace sub-chain. In addition, in an embodiment, randomly modifying the trace pattern includes reconnecting the trace sub-chain by adding trace segments connecting the open pair of adjacent trace segments, and adding trace segments connecting the other open pair of trace segments, to facilitate forming the randomly modified trace pattern. Advantageously, randomly modifying the trace pattern as noted to produce the randomly modified trace pattern enhances security of the secure volume by providing greater randomization to the process of establishing the random security circuitry pattern for fabricating the security circuit of the tamper-respondent sensor.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

Figure 1A:
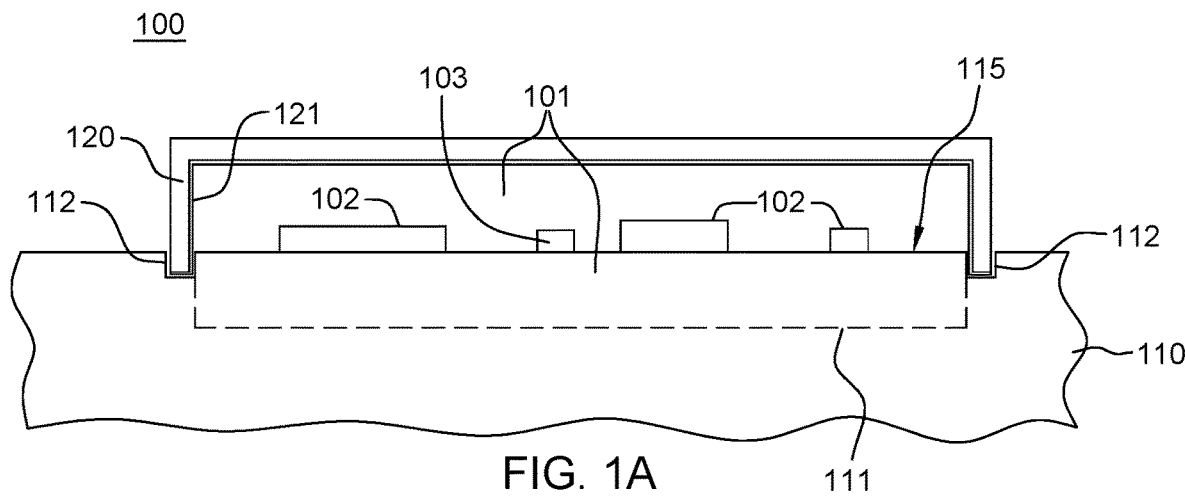
FIG. 1A is a cross-sectional elevational view of one embodiment of a tamper-proof electronic package, or tamper-respondent assembly, which can include a tamper-respondent sensor, in accordance with one or more aspects of the present disclosure.

In one or more aspects, a method is disclosed which includes establishing a random security circuit pattern for fabricating a security circuit of a tamper-respondent sensor to enclose, at least in part, one or more components within a secure volume. The establishing includes generating a trace pattern extending once through nodes of a plurality of nodes dispersed within an area of the tamper-respondent sensor, and randomly modifying the trace pattern to produce a randomly modified trace pattern with a desired randomization index relative to a specified randomization threshold, and providing the randomly modified trace pattern as the random security circuit pattern. In addition, the method includes initiating fabricating of the tamper-respondent sensor in-situ on a surface of an enclosure to facilitate defining the secure volume, where the fabricating uses the random security circuit pattern. Advantageously, the method enhances security of the secure volume by randomly modifying the trace pattern to produce the randomly modified trace pattern with the desired randomization index relative to the specified randomization threshold. Further, in-situ fabrication of the tamper-respondent sensor on the surface of the enclosure avoids need for adhesive to assemble the tamper-respondent sensor onto the enclosure, and eliminates the possibility of a cavity being induced within the adhesive. Further, yield is improved by in-situ-forming of the tamper-respondent sensor on the surface of the enclosure, eliminating any need to physically handle the tamper-respondent sensor during assembly.

In an embodiment, the security circuit is a multilayer security circuit, and the random security circuit pattern is used in fabricating one layer of the multilayer security circuit, and the method further includes establishing a respective random security circuit pattern for each layer of multiple layers of the multilayer security circuit, and the initiating fabricating includes initiating in-situ fabricating of the multilayer security circuit using the respective random security circuit patterns for the multiple layers of the multilayer security circuit. Advantageously, in-situ fabricating of the multilayer security circuit using respective random security circuit patterns for the multiple layers of the multilayer security circuit enhances security by making the tamper-respondent sensor less susceptible to reverse engineering or intrusion through the enhanced number of security circuit layers and enhanced randomization of each security circuit layer.

In an embodiment, the initiating fabricating includes initiating direct plating of the multilayer security circuit on the surface of the enclosure using the respective random security circuit patterns for the multiple layers of the multilayer security circuit. Advantageously, direct-plating of the multilayer security circuit on the surface of the enclosure enhances fabrication yield and makes the use of finer pitch security circuit traces practical.

In an embodiment, the surface of the enclosure includes a curved surface, and the direct plating includes laser-patterning in fabricating the multilayer security circuit on the surface of the enclosure using the respective random security circuit patterns. Advantageously, direct-plating of the multilayer security circuit on the surface of the enclosure, using the respective random security circuit patterns and laser-patterning, provides enhanced fabrication yield, particularly on the curved surface. Fabrication yield is improved over an approach where the tamper-respondent sensor is separately formed from the enclosure and adhesively attached to the surface of the enclosure, where the surface includes a curved surface.

In an embodiment, the trace pattern extends once through each node of the plurality of nodes between an input node and an output node, and the randomly modifying includes randomly modifying the trace pattern while ensuring that the randomly modified trace pattern extends once through the nodes of the plurality of nodes between the input and output nodes, and includes continuing to randomly modify the randomly modified trace pattern until the desired randomization index relative to the specified randomization threshold is reached. Continuing to randomly modify the randomly modified trace pattern until the desired randomization index relative to the specified randomization threshold is reached ensures a consistent level of randomization for improved security of the secure volume.

In an embodiment, generating the trace pattern includes dispersing the plurality of nodes uniformly within the area of the tamper-respondent sensor, determining an input node and an output node of the plurality of nodes, and creating the trace pattern extending once through the nodes of the plurality of nodes dispersed uniformly within the area of the tamper-respondent sensor between the input and output nodes. Advantageously, creating the trace pattern extending once through the plurality of nodes within the area, or area size, facilitates establishing the random security circuit pattern as noted for in-situ formation of the tamper-respondent sensor on the surface of the enclosure.

In an embodiment, creating the trace pattern extending once through the plurality of nodes within the area size includes creating the trace pattern as a serpentine trace pattern extending through the plurality of nodes within the area using a self-avoiding walk sequence. Advantageously, creating the trace pattern as a serpentine trace pattern through the plurality of nodes within the area using the self-avoiding walk sequence, and randomly modifying the trace pattern to produce the randomly modified trace pattern with the desired randomization index relative to the specified randomization threshold, enhances security by ensuring provision of a highly randomized security circuit pattern for in-situ formation of the tamper-respondent sensor on the surface of the enclosure.

In an embodiment, the method further includes determining the randomization index for the randomly modified trace pattern, where determining the randomization index includes determining, for each of i×i sub-block sizes, a number $N_j$ of different sub-block trace types within the randomly modified trace pattern extending through the plurality of nodes dispersed within the area, where $i \geq 2$. In addition, in one embodiment, determining the randomization index further includes determining, for each of the i×i sub-block sizes, a maximum possible number $P_i$ of different sub-block trace types within the randomly modified trace pattern extending through the plurality of nodes dispersed within the area. Further, in an embodiment, determining the randomization index includes ascertaining an entropy value for the randomly modified trace pattern using the number $N_i$ of different sub-block trace types within the randomly modified trace pattern, and the maximum possible number $P_i$ of different sub-block types within the randomly modified trace pattern, where the randomization index includes the entropy value. Advantageously, determining the randomization index for the randomly modified trace pattern relative to the specified randomization threshold based on entropy value ensures that the desired level of randomization is achieved during the randomly modifying of the trace pattern, thus ensuring consistency in providing a desired level of randomization to the random security circuit pattern being fabricated in-situ on the surface of the enclosure.

In an embodiment, ascertaining the entropy value includes determining:

$$S = \sum_{i=2}^{n} N_i / \sum_{i=2}^{n} P_i$$

where: S=the entropy value; i=a size of the i×i sub-block; $N_i$=number of different sub-block trace types within an i×i sub-block of the randomly modified trace pattern extending through the plurality of nodes dispersed within the specified area; and $P_i$=maximum possible number of different sub-block types within an i×i sub-block of the randomly modified trace pattern extending through the plurality of nodes dispersed within the specified area. Advantageously, ascertaining the entropy value as specified facilitates ensuring that the randomly modifying of the trace pattern produces the randomly modified trace pattern with a desired randomization index relative to the specified randomization threshold, thereby ensuring a desired level of randomization for enhanced security of the secure volume with in-situ fabrication of the tamper-respondent sensor on the surface of the enclosure using the random security circuit pattern.

In an embodiment, randomly modifying the trace pattern to produce the randomly modified trace pattern includes randomly opening a pair of adjacent trace segments of the trace pattern to produce a trace sub-chain unconnected to one of the input and output nodes, and randomly opening another pair of adjacent trace segments of the random pattern, where the other pair of adjacent trace segments includes a trace segment of the trace sub-chain. In addition, in an embodiment, randomly modifying the trace pattern includes reconnecting the trace sub-chain by adding trace segments connecting the open pair of adjacent trace segments, and adding trace segments connecting the other open pair of trace segments, to facilitate forming the randomly modified trace pattern. Advantageously, randomly modifying the trace pattern as noted to produce the randomly modified trace pattern enhances security of the secure volume by providing greater randomization to the process of establishing the random security circuitry pattern for fabricating the security circuit of the tamper-respondent sensor.

In accordance with one or more aspects, the embodiments are separable and optional from one another. Further, the above-noted embodiments can be combined with one another.

In another aspect, a computer system including a memory, and at least one processor in communication with the memory, is provided. The computer system is configured to perform a method, which includes establishing a random security circuit pattern for fabricating a security circuit of a tamper-respondent sensor to enclose, at least in part, one or more components within a secure volume. The establishing includes generating a trace pattern extending through nodes of the plurality of nodes dispersed within an area of the tamper-respondent sensor, and randomly modifying the trace pattern to produce a randomly modified trace pattern with a desired randomization index relative to a specified randomization threshold, and providing the randomly modified trace pattern as the random security circuit pattern. In addition, the method includes initiating fabricating of the tamper-respondent sensor in-situ on a surface of an enclosure to facilitate defining the secure volume, where the fabricating uses the random security circuit pattern. Advantageously, the method enhances security of the secure volume by randomly modifying the trace pattern to produce the randomly modified trace pattern with the desired randomization index relative to the specified randomization threshold. Further, in-situ fabrication of the tamper-respondent sensor on the surface of the enclosure avoids need for adhesive to assemble the tamper-respondent sensor onto the enclosure, and eliminates the possibility of a cavity being induced within the adhesive. Further, yield is improved by in-situ-forming of the tamper-respondent sensor on the surface of the enclosure, eliminating any need to physically handle the tamper-respondent sensor during assembly.

In an embodiment of the computer system, the security circuit is a multilayer security circuit, and the random security circuitry pattern is used in fabricating one layer of the multilayer security circuit. In addition, the method further includes establishing a respective random security circuit pattern for each layer of multiple layers of the multilayer security circuit, and the initiating fabricating includes initiating in-situ fabricating of the multilayer security circuit using the respective random security circuit patterns for the multiple layers of the multilayer security circuit. Advantageously, in-situ fabricating of the multilayer security circuit using respective random security circuit patterns for the multiple layers of the multilayer security circuit enhances security by making the tamper-respondent sensor less susceptible to reverse engineering or intrusion through the enhanced number of security circuit layers and enhanced randomization of each security circuit layer.

In an embodiment of the computer system, the trace pattern extends once through each node of the plurality of nodes between an input node and an output node, and the randomly modifying includes randomly modifying the trace pattern while ensuring that the randomly modified trace pattern extends once through the nodes of the plurality of nodes between the input and output nodes, and includes continuing to randomly modify the randomly modified trace pattern until the desired randomization index relative to the specified randomization threshold is reached. Continuing to randomly modify the randomly modified trace pattern until the desired randomization index relative to the specified randomization threshold is reached ensures a consistent level of randomization for improved security of the secure volume.

In an embodiment of the computer system, generating the trace pattern includes dispersing the plurality of nodes uniformly within the area of the tamper-respondent sensor, determining an input node and an output node of the plurality of nodes, and creating the trace pattern extending once through the nodes of the plurality of nodes dispersed uniformly within the area of the tamper-respondent sensor between the input and output nodes. Advantageously, creating the trace pattern extending once through the plurality of nodes within the area size facilitates establishing the random security circuit pattern as noted for in-situ formation of the tamper-respondent sensor on the surface of the enclosure.

In an embodiment of the computer system, the method further includes determining the randomization index for the randomly modified trace pattern, where determining the randomization index includes determining, for each of i×i sub-block sizes, a number $N_i$ of different sub-block trace types within the randomly modified trace pattern extending through the plurality of nodes dispersed within the area, where i≥2. In addition, in one embodiment, determining the randomization index further includes determining, for each of the i xi sub-block sizes, a maximum possible number $P_i$ of different sub-block trace types within the randomly modified trace pattern extending through the plurality of nodes dispersed within the area. Further, in an embodiment, determining the randomization index includes ascertaining an entropy value for the randomly modified trace pattern using the number $N_i$ of different sub-block trace types within the randomly modified trace pattern, and the maximum possible number $P_i$ of different sub-block types within the randomly modified trace pattern, where the randomization index includes the entropy value. Advantageously, determining the randomization index for the randomly modified trace pattern relative to the specified randomization threshold based on an entropy value ensures that the desired level of randomization is achieved during the randomly modifying of the trace pattern, thus ensuring consistency in providing a desired level of randomization to the random security circuit pattern being fabricated in-situ on the surface of the enclosure.

In an embodiment of the computer system, randomly modifying the trace pattern to produce the randomly modified trace pattern includes randomly opening a pair of adjacent trace segments of the trace pattern to produce a trace sub-chain unconnected to one of the input and output nodes, and randomly opening another pair of adjacent trace segments of the random pattern, where the other pair of adjacent trace segments includes a trace segment of the trace sub-chain. In addition, in an embodiment, randomly modifying the trace pattern includes reconnecting the trace sub-chain by adding trace segments connecting the open pair of adjacent trace segments, and adding trace segments connecting the other open pair of trace segments, to facilitate forming the randomly modified trace pattern. Advantageously, randomly modifying the trace pattern as noted to produce the randomly modified trace pattern enhances security of the secure volume by providing greater randomization to the process of establishing the random security circuitry pattern for fabricating the security circuit of the tamper-respondent sensor.

In a further aspect, a computer program product is provided which includes one or more computer-readable storage media and program instructions collectively stored on the one or more computer-readable storage media readable by at least one processor to establish a random security circuit pattern for fabricating a security circuit of a tamper-respondent sensor to enclose, at least in part, one or more components within a secure volume. The establishing includes generating a trace pattern extending once through each node of a plurality of nodes dispersed within an area of the tamper-respondent sensor, and randomly modifying the trace pattern to produce a randomly modified trace pattern with a desired randomization index relative to a specified randomization threshold, and providing the randomly modified trace pattern as the random security circuit pattern. The program instructions are further readable by the at least one processor to initiate fabricating of the tamper-respondent sensor in-situ on a surface of an enclosure to facilitate defining the secure volume, where the fabricating uses the random security circuit pattern. Advantageously, the method enhances security of the secure volume by randomly modifying the trace pattern to produce the randomly modified trace pattern with the desired randomization index relative to the specified randomization threshold. Further, in-situ fabrication of the tamper-respondent sensor on the surface of the enclosure avoids need for adhesive to assemble the tamper-respondent sensor onto the enclosure, and eliminates the possibility of a cavity being induced within the adhesive. Further, yield is improved by in-situ-forming of the tamper-respondent sensor on the surface of the enclosure, eliminating any need to physically handle the tamper-respondent sensor during assembly.

In an embodiment of the computer program product, generating the trace pattern includes dispersing the plurality of nodes uniformly within the area of the tamper-respondent sensor, determining an input node and an output node of the plurality of nodes, and creating the trace pattern extending once through the nodes of the plurality of nodes dispersed uniformly within the area of the tamper-respondent sensor between the input and output nodes. Advantageously, creating the trace pattern extending once through the plurality of nodes within the area facilitates establishing the random security circuit pattern as noted for in-situ formation of the tamper-respondent sensor on the surface of the enclosure.

In an embodiment of the computer program product, the method further includes determining the randomization index for the randomly modified trace pattern, where determining the randomization index includes determining, for each of i×i sub-block sizes, a number $N_i$ of different sub-block trace types within the randomly modified trace pattern extending through the plurality of nodes dispersed within the area, where i≥2. In addition, in one embodiment, determining the randomization index further includes determining, for each of the i xi sub-block sizes, a maximum possible number $P_i$ of different sub-block trace types within the randomly modified trace pattern extending through the plurality of nodes dispersed within the area. Further, in an embodiment, determining the randomization index includes ascertaining an entropy value for the randomly modified trace pattern using the number $N_i$ of different sub-block trace types within the randomly modified trace pattern, and the maximum possible number $P_i$ of different sub-block types within the randomly modified trace pattern, where the randomization index includes the entropy value. Advantageously, determining the randomization index for the randomly modified trace pattern relative to the specified randomization threshold based on entropy value ensures that the desired level of randomization is achieved during the randomly modifying of the trace pattern, thus ensuring consistency in providing a desired level of randomization to the random security circuit pattern being fabricated in-situ on the surface of the enclosure.

In an embodiment of the computer program product, randomly modifying the trace pattern to produce the randomly modified trace pattern includes randomly opening a pair of adjacent trace segments of the trace pattern to produce a trace sub-chain unconnected to one of the input and output nodes, and randomly opening another pair of adjacent trace segments of the random pattern, where the other pair of adjacent trace segments includes a trace segment of the trace sub-chain. In addition, in an embodiment, randomly modifying the trace pattern includes reconnecting the trace sub-chain by adding trace segments connecting the open pair of adjacent trace segments, and adding trace segments connecting the other open pair of trace segments, to facilitate forming the randomly modified trace pattern.

Advantageously, randomly modifying the trace pattern as noted to produce the randomly modified trace pattern enhances security of the secure volume by providing greater randomization to the process of establishing the random security circuitry pattern for fabricating the security circuit of the tamper-respondent sensor.

In another aspect, a method, computer system and computer program product are provided, which include establishing a random security circuit pattern for fabricating a security circuit of a tamper-respondent sensor to enclose, at least in part, one or more components within a secure volume. The establishing includes generating a trace pattern extending once through nodes of a plurality of nodes dispersed within an area of the tamper-respondent sensor, and randomly modifying the trace pattern to produce a randomly modified trace pattern with a desired randomization index relative to a specified randomization threshold, and providing the randomly modified trace pattern as the random security circuit pattern. In addition, the method includes initiating fabricating of the tamper-respondent sensor in-situ on a surface of an enclosure to facilitate defining the secure volume, where the fabricating uses the random security circuit pattern. Further, the security circuit is a multilayer security circuit, and the random security circuit pattern is used in fabricating one layer of the multilayer security circuit pattern. The process further includes establishing a respective security circuit pattern for each layer of the multiple layers of the multilayer security circuit, and the initiating fabricating includes initiating in-situ fabricating of the multilayer security circuit using the respective random security circuit patterns for the multiple layers of the multilayer security circuit. The trace pattern extends once through each node of the plurality of nodes between an input node and an output node, and the randomly modifying includes randomly modifying the trace pattern while ensuring that the randomly modified trace pattern extends once through the nodes of the plurality of nodes, and includes continuing to randomly modify the randomly modified trace pattern until the desired randomization index relative to the specified randomization threshold is reached. Advantageously, the process ensures security of the secure volume by randomly modifying the trace pattern to produce the randomly modified trace pattern with the desired randomization index relative to the specified randomization threshold. Continuing to randomly modify the randomly modified trace pattern until the desired randomization index relative to the specified randomization threshold is reached ensures a consistent level of randomization for improved security of the secure volume. Further, in-situ fabrication of the tamper-respondent sensor on the surface of the enclosure avoids need for adhesive to assemble the tamper-respondent sensor onto the enclosure and improves yield by eliminating any need to physically handle the tamper-respondent assembly during assembly. Advantageously, in-situ fabrication of the multilayer security circuit using respective random security circuit patterns for the multiple layers of the multilayer security circuit enhances security by making the tamper-respondent sensor less susceptible to reverse engineering or intrusion through the enhanced number of security circuit layers and enhanced randomization of each security circuit layer.

In another aspect, a method, computer system and computer program product are provided, which include establishing a random security circuit pattern for fabricating a security circuit of a tamper-respondent sensor to enclose, at least in part, one or more components within the secure volume. The establishing includes generating a trace pattern extending once through nodes of the plurality of nodes dispersed within an area of the tamper-respondent sensor, and randomly modifying the trace pattern to produce a randomly modified trace pattern with a desired randomization index relative to a specified randomization threshold, and providing the randomly modified trace pattern as the random security circuit pattern. In addition, the method includes initiating fabricating of the tamper-respondent sensor in-situ on a surface of an enclosure to facilitate defining the secure volume, where the fabricating uses the random security circuit pattern. The security circuit is a multilayer security circuit, and the random security circuit pattern is used in fabricating one layer of the multilayer security circuit pattern. The process further includes establishing a respective random security circuit pattern for each layer of the multiple layers of the multilayer security circuit, and the initiating fabricating includes initiating in-situ fabricating of the multilayer security circuit using the respective random security circuit patterns for the multiple layers of the multilayer security circuit. Generating the trace pattern includes dispersing the plurality of nodes uniformly within the area of the tamper-respondent sensor, determining an input node and an output node of the plurality of nodes, and creating the trace pattern extending once through the nodes of the plurality of nodes dispersed uniformly within the area of the tamper-respondent sensor between the input and output nodes. Advantageously, the method enhances security of the secure volume by randomly modifying the trace pattern to produce the randomly modified trace pattern with a desired randomization index relative to the specified randomization threshold. Creating the trace pattern extending once through the plurality of nodes within the area facilitates establishing the random security circuit pattern as noted for in-situ formation of the tamper-respondent sensor on the surface of the enclosure. In-situ fabricating of the multilayer security circuit using respective random security circuit patterns for the multiple layers of the multilayer security circuit enhances security by making the tamper-respondent sensor less susceptible to reverse engineering or intrusion through the enhanced number of security circuit layers and enhanced randomization of each security circuit layer. Further, in-situ fabrication of the tamper-respondent sensor on the surface of the enclosure avoids the need for adhesive to assemble the tamper-respondent sensor onto the enclosure, and improves yield by eliminating any need to physically handle the tamper-respondent sensor during assembly.

In a further aspect, a method, computer system and computer program product are provided, which include establishing a random security circuit pattern for fabricating a security circuit of a tamper-respondent sensor to enclose, at least in part, one or more components within a secure volume. The establishing includes generating a trace pattern extending once through the nodes of the plurality of nodes dispersed within an area of the tamper-respondent sensor, and randomly modifying the trace pattern to produce a randomly modified trace pattern with a desired randomization index relative to a specified randomization threshold, and providing the randomly modified trace pattern as the random security circuit pattern. In addition, the method includes initiating fabricating of the tamper-respondent sensor in-situ on a surface of an enclosure to facilitate defining the secure volume, where the fabricating uses the random security circuit pattern. The security circuit is a multilayer security circuit, and the random security circuit pattern is used in fabricating one layer of the multilayer security circuit. The method further includes establishing a respective random security circuit pattern for each layer of multiple layers of the multilayer security circuit, and the initiating fabricating includes initiating in-situ fabricating of the multilayer security circuit using the respective random security circuit patterns for the multiple layers of the multilayer security circuit. Generating the trace pattern includes dispersing the plurality of nodes uniformly within the area of the tamper-respondent sensor, determining an input node and an output node of the plurality of nodes, and creating the trace pattern extending once through the nodes of the plurality of nodes dispersed uniformly within the area of the tamper-respondent sensor between the input and output nodes. Randomly modifying the trace pattern to produce the randomly modified trace pattern includes randomly opening a pair of adjacent trace segments of the trace pattern to produce a trace sub-chain unconnected to one of the input and output nodes, and randomly opening another pair of adjacent trace segments of the random pattern, where the other pair of adjunct trace segments includes a trace segment of the trace sub-chain. In addition, randomly modifying the trace pattern includes reconnecting the trace sub-chain by adding trace segments connecting the open pair of adjacent trace segments and adding trace segments connecting the other open pair of trace segments to facilitate forming the randomly modified trace pattern. Advantageously, the method enhances security of the secure volume by randomly modifying the trace pattern to produce the randomly modified trace pattern with a desired randomization index relative to the specified randomization threshold. Creating the trace pattern extending once through the plurality of nodes within the area size facilitates establishing the random security circuit pattern as noted for in-situ formation of the tamper-respondent sensor on the surface of the enclosure. Advantageously, randomly modifying the trace pattern as noted to produce the randomly modified trace pattern ensures security of the secure volume by providing greater randomization to the process of establishing the random security circuit pattern for fabricating the security circuit of the tamper-respondent sensor. In-situ fabrication of the multilayer security circuit using respective random security circuit patterns for the multiple layers of the multilayer security circuit enhances security by making the tamper-respondent sensor less susceptible to reverse engineering or intrusion through the enhanced number of security circuit layers and enhanced randomization of each security circuit layer.

Aspects of the present disclosure and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the disclosure in detail. It should be understood, however, that the detailed description and the specific example(s), while indicating aspects of the disclosure, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for case of understanding, wherein the same reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application of the concepts disclosed.

Note that also that illustrative embodiments are described below using specific code, designs, architectures, protocols, layouts, schematics, or tools, only as examples, and not by way of limitation. Furthermore, the illustrative embodiments may be described in certain instances using particular software, hardware, tools, or data processing environments, only as example for clarity of description. The illustrative embodiments can be used in conjunction with other comparable or similarly purposed structures, systems, applications, or architectures. One or more aspects of an illustrative embodiments can be implemented in software, hardware, or a combination thereof.

Figure 19:
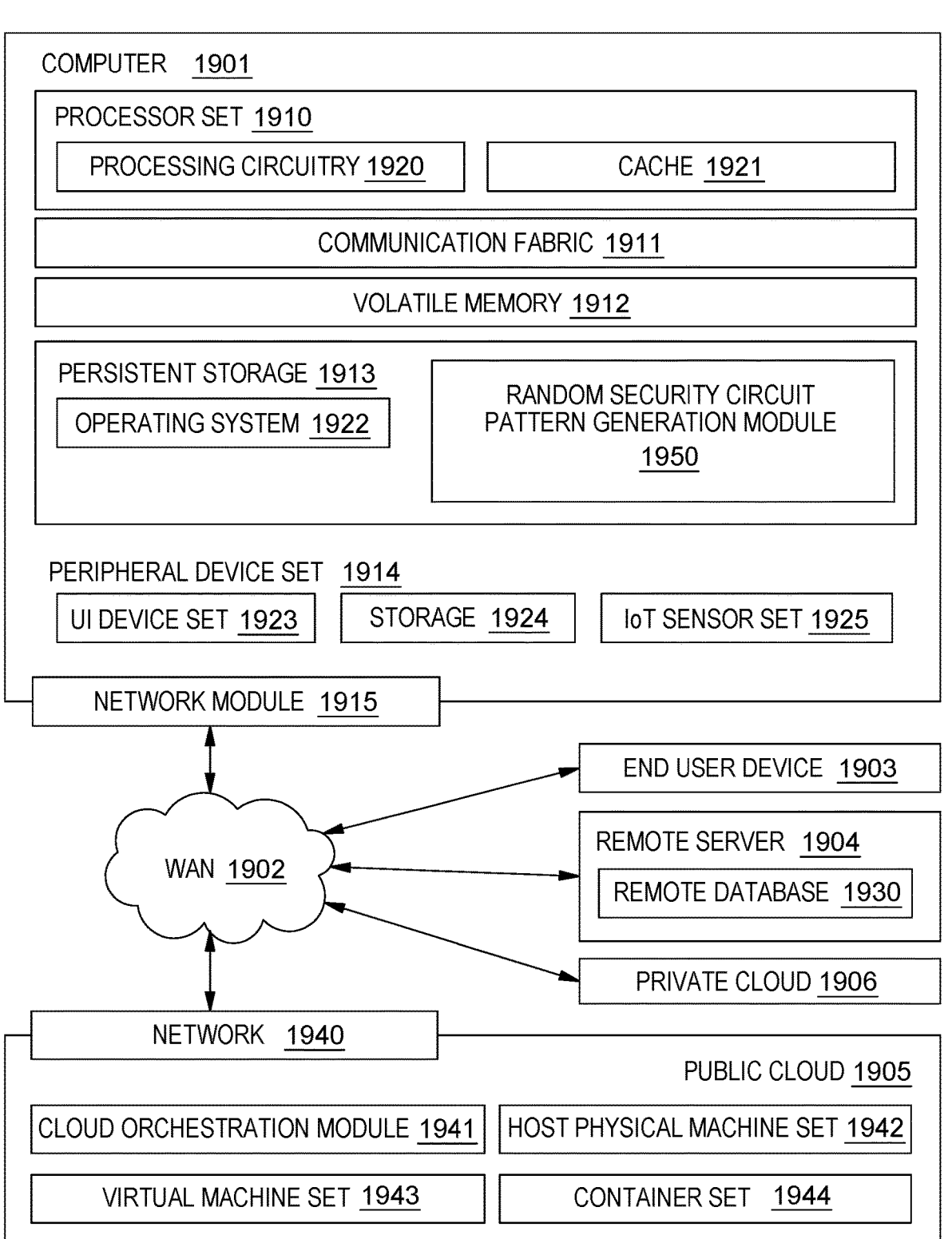
FIG. 19 depicts one example of a computing environment to include and/or use one or more aspects of the present disclosure.

As understood by those skilled in the art, program code as referred to in this application, can include software, and/or hardware. For example, program code in certain embodiments of the present disclosure can utilizes a software-based implementation of the functions described, while other embodiments can include fixed function hardware. Certain embodiments combine both types of program code. Examples of program code, also referred to as one or more programs, are depicted in FIG. 19, including operating system 1922 and random security circuit pattern generation module 1950, which are stored in persistent storage 1913.

Disclosed herein are certain novel methods of fabricating tamper-respondent sensors and assemblies to, for instance, facilitate secure electronic communications using encryption/decryption systems. In one or more implementations, various tamper-respondent sensors and methods of fabrication are disclosed which provide, for instance, a security Level 4 secure volume for accommodating one or more electronic components, such as one or more encryption and/or decryption modules and associated components of, for instance, a communications card or other electronic assembly to be protected, which can provide enhanced tamper protection.

Figure 1B:
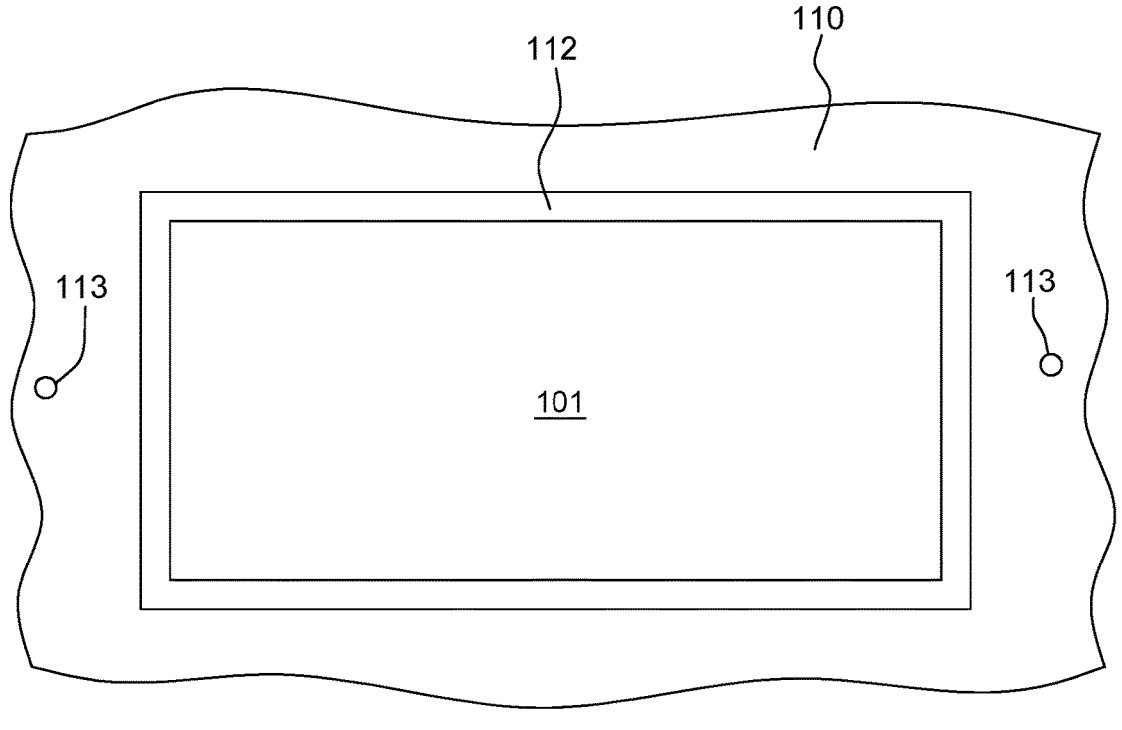
FIG. 1B is a top plan view of the multilayer circuit board of FIG. 1A, in accordance with one or more aspects of the present disclosure.

Referring to FIGS. 1A & 1B, one embodiment of a tamper-proof electronic package or tamper-respondent assembly 100 is depicted, which includes one or more electronic components, such as a circuit 115 and/or electronic devices (or elements) 102 coupled to a multilayer circuit board 110.

Referring collectively to FIGS. 1A & 1B, circuit 115 resides on or is embedded within multilayer circuit board 110, which also has an embedded tamper-respondent sensor 111 that facilitates defining, in part, a secure volume 101 associated with multilayer circuit board 110 that (in one or more embodiments) extends into multilayer circuit board 110. In particular, in the embodiment of FIGS. 1A & 1B, secure volume 101 can exist partially within multilayer circuit board 110, and partially above multilayer circuit board 110. One or more electronic devices 102 are mounted to multilayer circuit board 110 within secure volume 101 and can include, for instance, one or more encryption modules and/or decryption modules, and/or associated components, to be protected within the tamper-proof electronic package. In one or more implementations, the one or more electronic components to be protected can include, for instance, components of a secure communications card of a computer system.

Tamper-proof electronic package 100 further includes an enclosure 120, such as a five-sided or pedestal-type enclosure, mounted to multilayer circuit board 110 within, for instance, a continuous groove (or trench) 112 formed within an upper surface of multilayer circuit board 110, and secured to the multilayer circuit board 110 via, for instance, a structural adhesive disposed within continuous groove 112. In one or more embodiments, enclosure 120 can be made of a thermally conductive material to operate as a heat sink for facilitating cooling of the one or more electronic components 102 within the secure volume. A security mesh or tamper-respondent sensor 121 can be associated with enclosure 120, for example, on the inner surface of enclosure 120, to facilitate defining, in combination with tamper-respondent sensor 111 embedded within multilayer circuit board 110, secure volume 101. In one or more other implementations, enclosure 120 can be securely affixed to a surface of multilayer circuit board 110 (without a continuous groove) using, for instance, a bonding material such as an epoxy or other adhesive.

Briefly described, tamper-respondent sensor 121 can include, in one or more examples, one or more tamper-detection layers which include circuit lines or traces provided on one or both sides of, or within, a structural layer, which in one or more implementations, can be an insulating layer or film. The circuit lines can be of a line width and have a pitch or line-to-line spacing such that piercing of the layer at any point results in damage to one or more of the circuit lines or traces. In one or more implementations, the circuit lines can define one or more conductors which can be electrically connected in a network to a monitor circuit or detector 103, which monitors, for instance, resistance on the lines. Detection of a change in resistance caused by cutting or damaging one or more of the lines, will cause information within the secure volume to be automatically erased. The conductive lines of the tamper-respondent sensor can be in any desired pattern, such as a sinusoidal pattern or a random pattern (as described further below), to make it more difficult to breach the tamper-detection layer without detection.

For resistive monitoring, a variety of materials can be employed to form the circuit lines. For instance, the circuit lines can be formed of a metal or metal alloy, such as copper, or silver, or can be formed, for example, of an intrinsically-conductive polymer, carbon ink, or nickel phosphorous (NiP), or Omega-ply®, offered by Omega Technologies, Inc., of Culver City, California (USA), or Ticer™, offered by Ticer Technologies, Chandler, Arizona (USA). The process employed to form the fine circuit lines or traces is dependent, in part, on the choice of materials used for the circuit lines. For instance, if copper circuit lines are fabricated, then additive processing, such as plating of copper traces, or subtractive processing, such as etching away unwanted copper between trace lines, can be employed. In certain other embodiments, 3-D printing can be used to form the traces of the tamper-respondent sensor.

As noted, in one or more implementations, the circuit lines or traces of the tamper-respondent sensor(s) can line the inner surface(s) of enclosure 120, or in one or more embodiments described herein, be printed directly on the inner surface of enclosure 120, and can be connected to define one or more security circuits or networks.

As depicted in FIG. 1B, one or more external circuit connection vias 113 can be provided within multilayer circuit board 110 for electrically connecting to the one or more electronic components within secure volume 101. These one or more external circuit connection vias 113 can electrically connect to one or more external signal lines or planes (not shown) embedded within multilayer circuit board 110 and extending, for instance, into a secure base region of (or below) secure volume 101. Electrical connections to and from secure volume 101 can be provided by coupling to such external signal lines or planes within the multilayer circuit board 110.

As noted, secure volume 101 can be sized to house one or more electronic components to be protected and can be constructed to extend into multilayer circuit board 110. In one or more implementations, multilayer circuit board 110 includes electrical interconnect within the secure volume 101 defined in the board, for instance, for electrically connecting one or more tamper-detection or security circuit layers of the embedded tamper-respondent sensor 111 to associated monitor circuitry also disposed within secure volume 101, along with, for instance, one or more daughter cards, such as memory DIMMs, PCIe cards, processor cards, etc.

Note that the packaging embodiment depicted in FIGS. 1A & 1B is presented by way of example only. Other configurations of enclosure 120, or multilayer circuit board 110 can be employed, and/or other approaches to coupling enclosure 120 and multilayer circuit board 110 can be used. For instance, in one or more alternate implementations, enclosure 120 can be securely affixed to an upper surface of multilayer circuit board 110 (without a continuous groove) using, for instance, a structural bonding material such as an epoxy or other adhesive.

Figure 2:
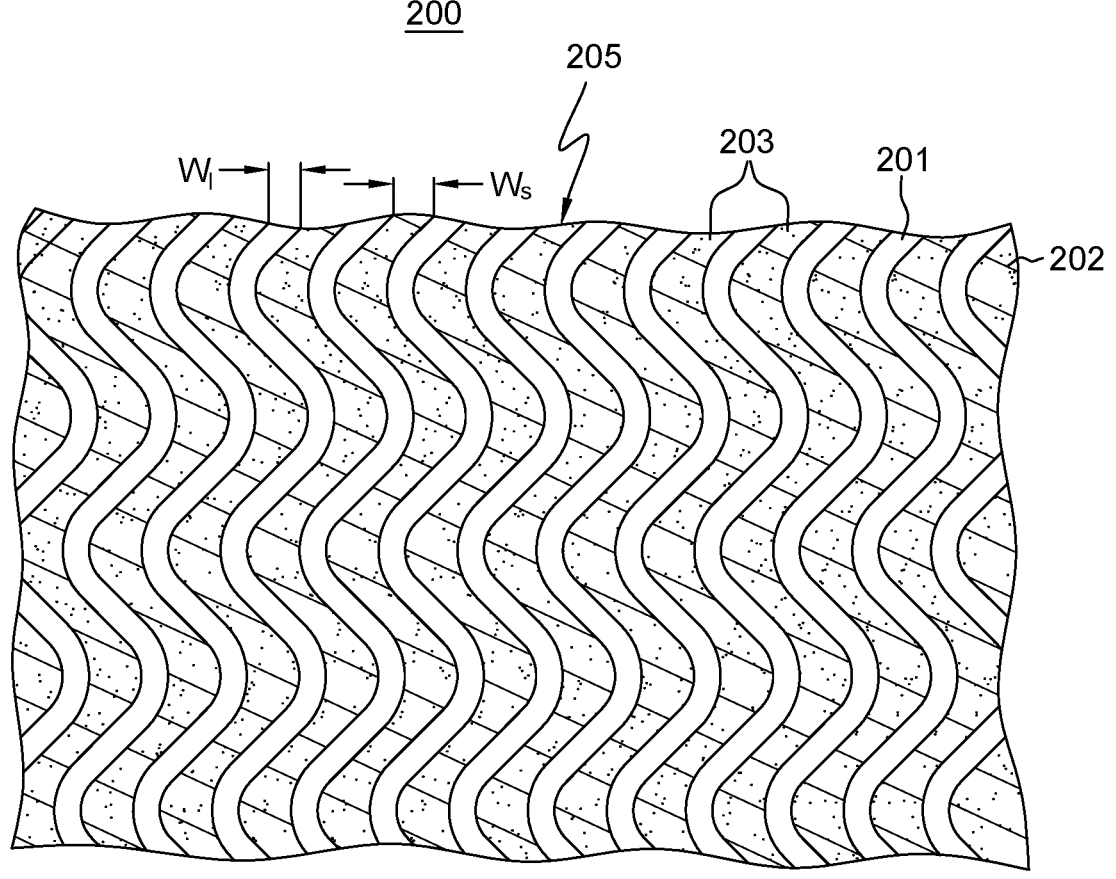
FIG. 2 depicts one embodiment of a tamper-respondent sensor with conductive lines forming, in part, at least one security circuit, or tamper-detect circuit, of a tamper-respondent assembly, in accordance with one or more aspects of the present disclosure.

By way of example, FIG. 2 depicts a portion of one embodiment of a tamper-detection layer 205 (or laser and pierce-respondent layer) of a tamper-respondent sensor 200 or security sensor. In the FIG. 2 embodiment, tamper-detection layer 205 includes tamper-detect circuit lines or traces 201 provided on one or both opposite sides of a layer, such as a flexible layer 202, which in one or more embodiments, can be a flexible insulating layer or film.

FIG. 2 illustrates circuit lines 201 on, for instance, one side of flexible layer 202, with the traces on the opposite side of the film being, for instance, the same pattern, but (in one or more embodiments) offset to lie directly below spaces 203, between circuit lines 201. The circuit lines on one side of the flexible layer can be of a line width $W_l$ and have a pitch or line-to-line spacing $W_s$ such that piercing of the layer 205 at any point results in damage to at least one of the circuit lines traces 201. In one or more implementations, the circuit lines can be electrically connected in-series or parallel to define one or more conductors which can be electrically connected in a network to a monitor circuit, which can, in one or more implementations, monitor the resistance of the lines. In one embodiment, detection of an increase, or other change, in resistance, caused by cutting or damaging one of the traces, can cause information within the encryption and/or decryption module to be erased. Providing conductive lines 201 in a pattern, such as a sinusoidal pattern, can make it more difficult to breach tamper-detection layer 205 without detection. Note, in this regard, that conductive lines 201 can be provided in any desired pattern. For instance, in an alternate implementation, conductive lines 201 can be provided as parallel, straight conductive lines, if desired, and the pattern or orientation of the pattern can vary between sides of a layer, and/or between layers. Alternatively, the conductive lines or conductive traces of the tamper-respondent sensor can be random, as described further below with reference to FIGS. 6A-21.

As intrusion technology continues to evolve, anti-intrusion technology needs to continue to improve to stay ahead. In one or more implementations, the tamper-respondent sensor can cover or line an inner surface of an enclosure to provide a secure volume about at least one electronic component to be protected. Further, the tamper-respondent sensor, or more particularly, the security circuit(s) of the sensor, can be embedded within a multilayer circuit board, such as described below. Certain further enhanced sensor embodiments are also described and claimed herein.

Note that a variety of materials can advantageously be employed to form the circuit lines. For instance, the circuit lines can be formed of a conductive ink (such as a carbon-loaded conductive ink) printed onto or into one or more of the layers in a stack of layers of the sensor. Alternatively, a metal or metal alloy can be used to form the circuit lines, such as copper, silver, intrinsically conductive polymers, carbon ink, or nickel-phosphorus (NiP), such as Omega-Ply®, offered by Omega Technologies, Inc. of Culver City, California (USA), or nickel-chrome, such as Ticer™ offered by Ticer Technologies, Chandler, Arizona (USA). Note that the process employed to form the fine circuit lines or traces on the order described herein can be dependent, in part, on the choice of material used for the circuit lines. For instance, if copper circuit lines are being fabricated, then additive processing, such as plating up copper traces, or subtractive processing, such as etching away unwanted copper between trace lines, can be employed.

Figure 3:
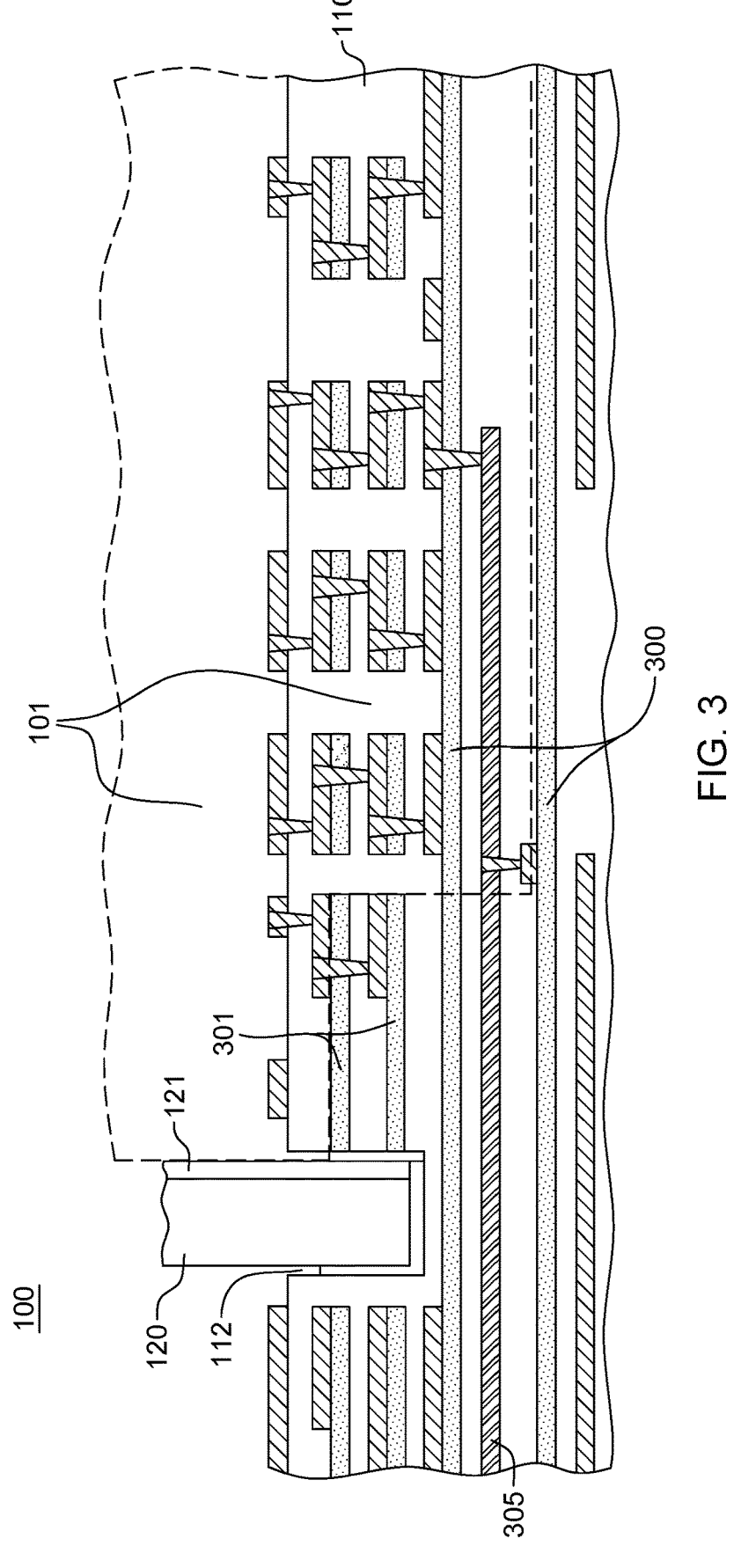
FIG. 3 is a partial cross-sectional elevational view of a more detailed embodiment of a tamper-respondent assembly, in accordance with one or more aspects of the present disclosure.

By way of further example, FIG. 3 depicts a partial cross-sectional elevational view of a more detailed embodiment of tamper-proof electronic package 100, and in particular, of multilayer circuit board 110, to which enclosure 120 is secured. In this configuration, the embedded tamper-respondent sensor includes multiple tamper-detection layers including, by way of example, at least one tamper-detection mat (or base) layer 300, and at least one tamper-detection frame 301. In the example depicted, two tamper-detection mat layers 300 and two tamper-detection frames 301 are illustrated, by way of example only. The lower-most tamper-detection mat layer 300 can be a continuous sense or detect layer extending completely below the secure volume being defined within and/or above multilayer circuit board 110. One or both tamper-detection mat layers 300 below secure volume 101 can be partitioned into multiple circuit zones, if desired. Within each tamper-detection mat layer, or more particularly, within each circuit zone of each tamper-detection mat layer, multiple circuits or conductive traces can be provided in any desired configuration. Further, the conductive traces within the tamper-detection layers can be implemented as, for instance, a resistive layer.

As illustrated, one or more external signal lines or planes 305 can enter secure volume 101 between, in one embodiment, two tamper-detection mat layers 300, and then electrically connect upwards into the secure volume 101 through one or more conductive vias, arranged in any desired location and pattern. In the configuration depicted, the one or more tamper-detection frames 301 are disposed at least inside of the area defined by continuous groove 112 accommodating the base of enclosure 120. Together with the tamper-respondent sensor(s) 121 associated with enclosure 120, tamper-detection frames 301, and tamper-detection mat layers 300, define secure volume 101, which can extend, in part, into multilayer circuit board 110. With secure volume 101 defined, in part, within multilayer circuit board 110, the external signal line(s) 305 can be securely electrically connected to, for instance, the one or more electronic components mounted to, or of, multilayer circuit board 110 within secure volume 101. In addition, secure volume 101 can accommodate electrical interconnection of the conductive traces of the multiple tamper-detection layers 300, 301, for instance, via appropriate monitor circuitry.

Added security can be provided by extending tamper-detection mat layers 300 (and if desired, tamper-detection frames 301) outward past the periphery of enclosure 120. In this manner, a line of attack can be made more difficult at the interface between enclosure 120 and multilayer circuit board 110 since the attack would need to clear, for instance, tamper-detection mat layers 300, the enclosure 120, as well as the tamper-detection frames 301 of the embedded tamper-detect circuit.

Numerous variations on multilayer circuit board 110 of FIGS. 1A-1B & 3 are possible. For instance, in one embodiment, the embedded tamper-detect circuit can include one or more tamper-detection mat layers 300 and one or more tamper-detection frames 301, such as described above, and a tri-plate structure comprising one or more external signal lines or layers sandwiched between an upper ground plane and a lower ground plane. In this configuration, high-speed transfer of signals to and from the secure volume, and in particular, to and from the one or more electronic components resident within the secure volume, can be facilitated.

Figure 4:
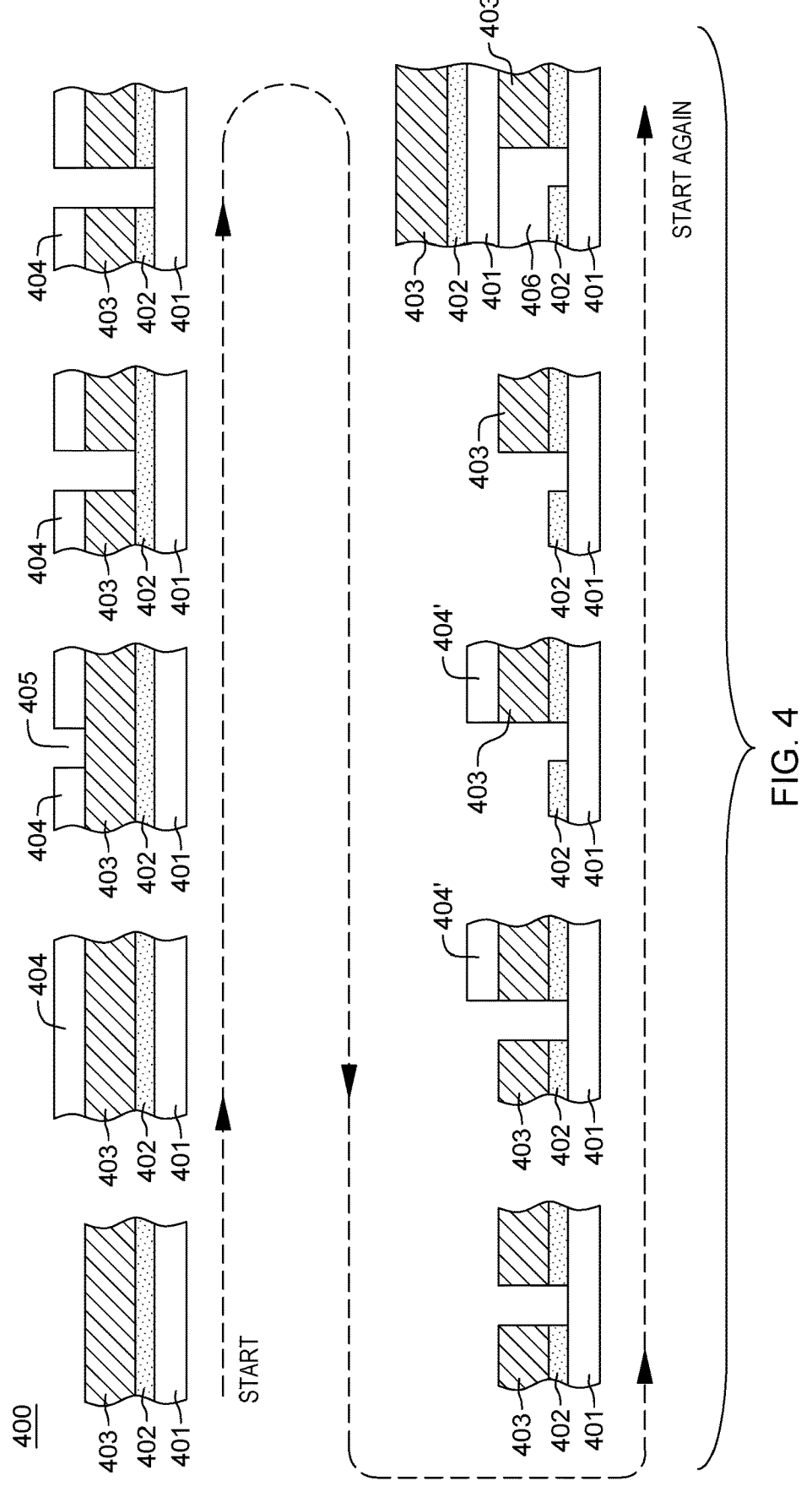
FIG. 4 depicts one embodiment of a process of fabricating a multilayer circuit board with an embedded tamper-detect circuit for a tamper-respondent assembly, in accordance with one or more aspects of the present disclosure.

In one or more implementations, the multilayer circuit board can be a multilayer wiring board or printed circuit board, or card, formed, for instance, by building up the multiple layers of the board. FIG. 4 illustrates one embodiment for forming and patterning a tamper-detection layer within such a multilayer circuit board.

As illustrated in FIG. 4, in one or more implementations, a tamper-detection layer, such as a tamper-detection mat layer or a tamper-detection frame disclosed herein, can be formed by providing a material stack comprising, at least in part, a structural layer 401, such as a pre-preg (or pre-impregnated) material layer, a trace material layer 402 for use in defining the desired trace patterns, and an overlying conductive material layer 403, to be patterned to define conductive contacts or vias electrically connecting to the pattern of traces being formed within the trace material layer 402, for instance, at trace terminal points. In one or more implementations, the trace material layer 402 can include nickel phosphorous (NiP), and the overlying conductive layer 403 can include copper. Note that these materials are identified by way of example only, and that other trace and/or conductive materials may be used within the build-up 400.

A first photoresist 404 is provided over build-up 400, and patterned with one or more openings 405, through which the overlying conductive layer 403 can be etched. Depending on the materials employed, and the etch processes used, a second etch process can be desired to remove portions of trace material layer 402 to define the conductive traces of the subject tamper-detection layer. First photoresist 404 can then be removed, and a second photoresist 404' is provided over the conductive layer 403 features to remain, such as the input and output contacts. Exposed portions of conductive layer 403 are then etched, and the second photoresist 404' can be removed, with any opening in the layer being filled, for instance, with an adhesive (or pre-preg) 406 and a next build-up layer is provided, as shown. Note that in this implementation, most of overlying conductive layer 403 is etched away, with only the conductive contacts or vias remaining where desired, for instance, at the terminal points of the traces formed within the layer by the patterning of the trace material layer 402. Note that any of a variety of materials can be employed to form the conductive lines or traces within a tamper-detection layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which can be employed include OhmegaPly®, offered by Ohmega Technologies, Inc., of Culver City, California (USA), or Ticer™, offered by Ticer Technologies of Chandler, Arizona (USA).

The trace lines or circuits within the tamper-detection layers, and in particular, the tamper-detection circuit zones, of the embedded tamper-detect circuit, or security circuit, along with the tamper-respondent sensor monitoring the enclosure, can be electrically connected to monitor circuitry provided, for instance, within secure volume 101 (FIG. 1A) of the tamper-respondent assembly. The monitor circuitry can include various bridges or compare circuits, and conventional printed wiring board electrical interconnect inside secure volume 101 (FIG. 1A), for instance, located within the secure volume defined by the tamper-detection frames 301 (FIG. 3), and the tamper-detection mat layers 300 (FIG. 3).

Note that advantageously, different tamper-detection circuit zones on different tamper-detection layers can be electrically interconnected into, for instance, a common tamper-detect circuitry. Thus, any of a large number of interconnect configurations are possible. Note also, that the power supply or battery for the tamper-respondent sensor(s) can be located internal or external to the secure volume, with the sensor being configured in one or more embodiments to trip and destroy any protected or critical data if the power supply or battery is tampered with.

Figure 5:
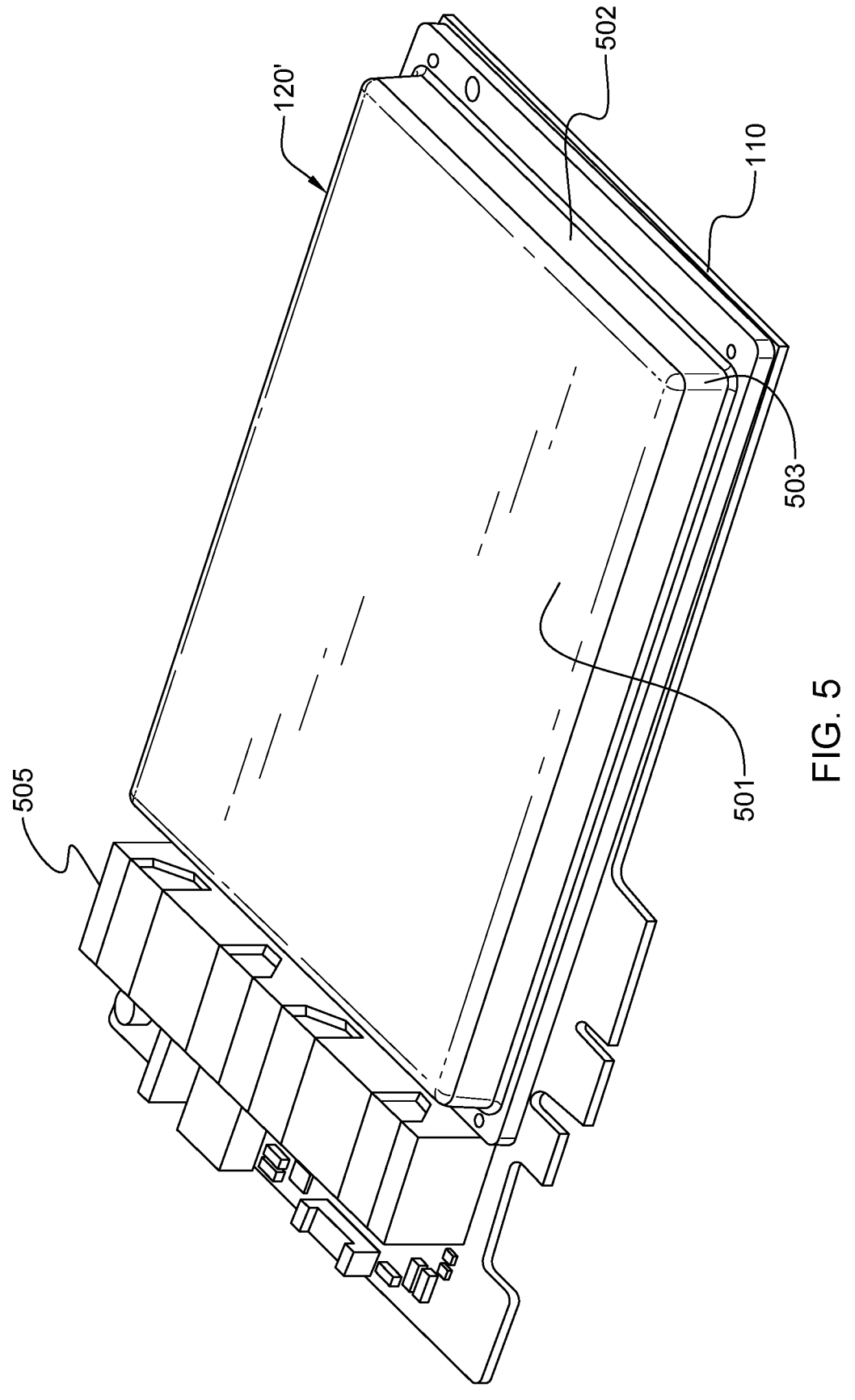
FIG. 5 is an isometric view of one embodiment of a tamper-respondent assembly, in accordance with one or more aspects of the present disclosure.

By way of further example, an isometric view of one embodiment of a tamper-respondent assembly is depicted in FIG. 5, where an enclosure 120' (similar to enclosure 120 of FIG. 1A) is shown sealed to multilayer circuit board 110 to define a secure volume about one or more electronic components. In the embodiment depicted, enclosure 120' is formed of a thermally conductive material, and includes a main surface 501 and sidewall(s) 502 which include sidewall corners 503. An inner surface of enclosure 120' includes an inner main surface, and an inner sidewall surface corresponding to main surface 501 and sidewall(s) 502 respectively, with the inner main surface and inner sidewall surfaces being covered, in one embodiment, by one or more tamper-respondent sensors, such as described herein. A power supply 505 or battery for the tamper-respondent sensor can be located, as depicted in this embodiment, external to the secure volume, with the tamper detector being configured to destroy any protected or critical data if the power supply or battery is tampered with. Enclosure 120' can be adhered to multilayer circuit board 110, which as noted herein, can include its own tamper protection in a variety of configurations.

When considering tamper-proof packaging, the electronic package needs to achieve defined tamper-proof requirements, such as those set forth in the National Institutes of Standards and Technology (NIST) Publication FIPS 140-2, which is a U.S. Government Computer Security Standard, used to accredit cryptographic modules. The NIST FIPS 140-3 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs).

A potential issue with a flexible security mesh lining an inner surface of an enclosure is that it might be susceptible to tampering, particularly at the corners and edges due to bending and stretching of the security mesh, which could potentially compromise the security circuit. Stretching of a tamper-respondent sensor with flexible layers can also reduce the width of the conductive traces, which can leave a larger area for a malefactor in which to attempt access into the secure volume without triggering the monitor circuit. Additional conductive traces can be added to existing flexible security meshes, but additional traces can lead to a lower change in resistance when a tamper event occurs, making the attempted intrusion more difficult to detect. Another issue with existing mesh security circuits for, for instance, cryptographic card assemblies, is that they are typically identical, and so it might be possible to learn the circuit pattern by sacrificing and carefully milling down the security mesh of one sensor to obtain the circuit pattern, and thereby facilitate gaining access to the encryption/decryption keys stored within the secure volume of another tamper-respondent assembly, without triggering erasure of the secure information.

Disclosed herein, in one or more aspects, are enhanced methods of fabricating tamper-respondent sensors for tamper-respondent assemblies. In one or more embodiments, computer-implemented methods, computer systems and computer program products are provided, where program code is executed to perform a method, which includes, for instance, establishing a random security circuit pattern for fabricating a security circuit of a tamper-respondent sensor to enclose, at least in part, one or more components within a secure volume. The establishing includes generating a trace pattern extending once through nodes of a plurality of nodes dispersed within a specified area or area size of the tamper-respondent sensor, and randomly modifying the trace pattern to produce a randomly modified trace pattern with a desired randomization index relative to a specified randomization threshold, and based thereon, providing the randomly modified trace pattern as the random security circuit pattern. In addition, the method includes initiating fabricating of the tamper-respondent sensor in-situ on a surface of an enclosure to facilitate defining the secure volume, with the fabricating using the random security circuit pattern.

Figure 6A:
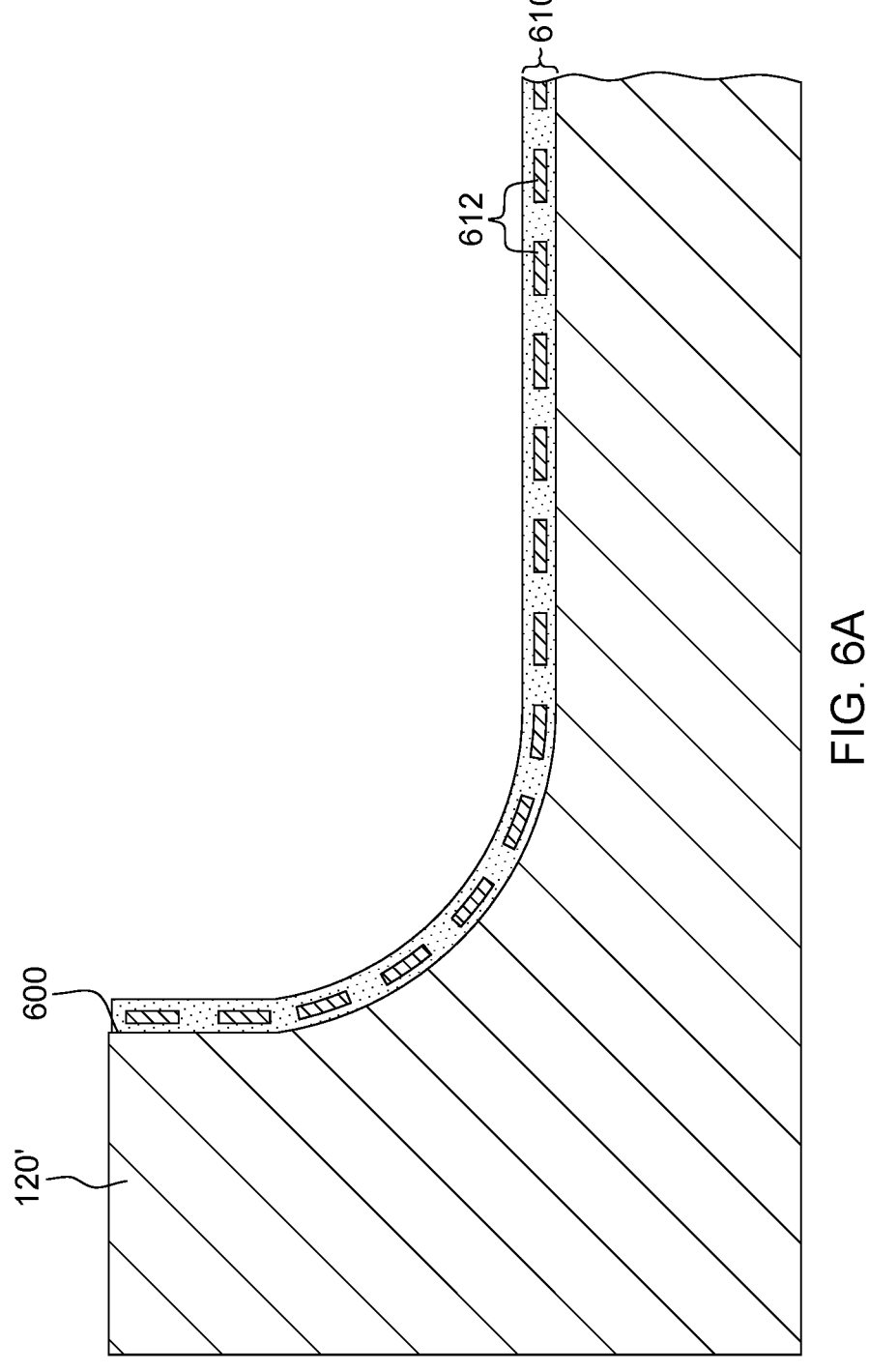
FIG. 6A depicts one embodiment of a tamper-respondent sensor formed in-situ on a surface of an enclosure to enclose one or more components in a secure volume, in accordance with one or more aspects of the present disclosure.

In one or more embodiments, the initiating fabricating can include initiating direct plating of the multilayer security circuit on the surface of the enclosure using the random security circuit pattern. An embodiment of this is depicted in FIG. 6A, where an inner surface 600 of enclosure 120' includes, at least in part, an in-situ formed tamper-respondent sensor 610 (similar to tamper-respondent sensor(s) 121 associated with enclosure 120 of FIG. 1A). In this case, tamper-respondent sensor 610 is formed directly on inner surface 600 of enclosure 120' including, in the example, on a curved surface of enclosure 120', such as a curved inner sidewall surface. In the embodiment of FIG. 6A, tamper-respondent sensor 610 includes a security circuit 612, which includes a conductive trace directly fabricated on the inner surface of the enclosure. Those skilled in the art will note that in-situ fabrication of a tamper-respondent sensor "on" a surface of the enclosure includes forming the tamper-respondent sensor directly on the surface of the enclosure or on one or more layers or films formed on the surface of the enclosure.

By way of specific example, security circuit 612 can be formed of copper, and thermally conductive enclosure 120' can be formed of a metal, such as aluminum or copper, or a metal composite. The conductive trace(s) forming security circuit 612 can have any of a variety of different widths, pitches and thicknesses. For instance, in one embodiment, the conductive traces can be copper traces formed approximately 10 μm thick, with an approximately 100 μm width, and an approximately 100 μm line-to-line spacing.

Figure 6B:
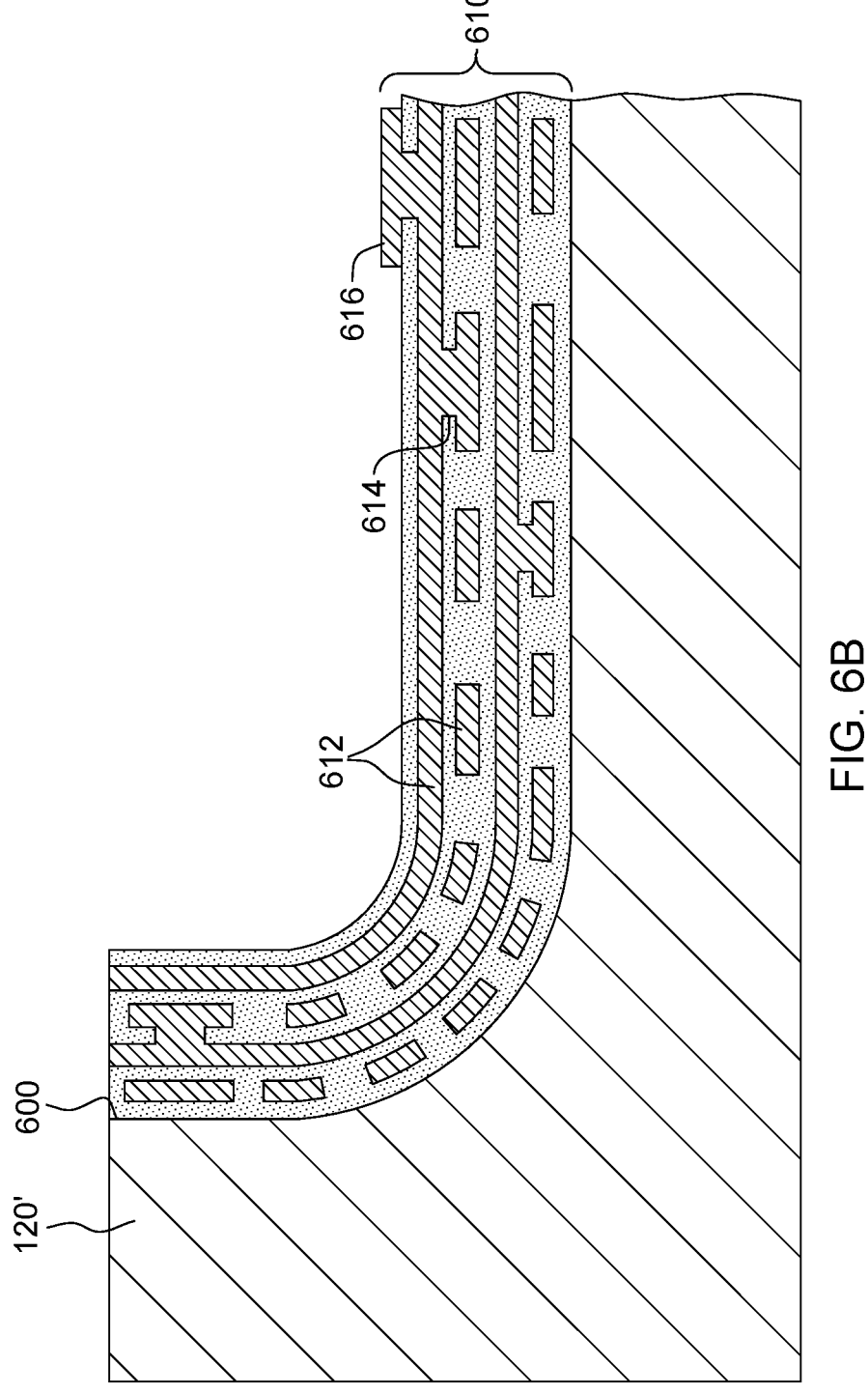
FIG. 6B depicts another embodiment of an in-situ formed tamper-respondent sensor on a surface of an enclosure to enclose one or more components in a secure volume, in accordance with one or more aspects of the present disclosure.

As illustrated in FIG. 6B, the direct building of conductive security circuits on the surface, including the inner curved surface, of enclosure 120' can be repeated a desired number of times to create a multilayer security circuit 610', where the different security circuit layers can be interconnected by conductive vias, such as conductive micro-vias 614, which can be arranged in a staggered manner and/or a randomly formed manner between the multilayer security circuit layers during in-situ fabrication. In the embodiment of FIG. 6B, four security circuit layers 612 are depicted within the multilayer security circuit 610', by way of example only. Advantageously, with fabricating of the tamper-respondent sensor in-situ on the surface of the enclosure, there is no handling of tamper-respondent sensor or bending of the tamper-respondent sensor to position and security the tamper-respondent sensor onto a surface, such as a curved surface of the tamper-respondent assembly, and no adhesive is needed to adhere the tamper-respondent sensor to the enclosure. This also avoids the possibility of cavities being induced in an adhesive material between the tamper-respondent sensor and the enclosure. Further, fabrication yield is improved using in-situ fabrication, and finer pitch spacing is achievable using, for instance, laser-patterning. As illustrated in the embodiment of FIG. 6B, contact pads 616 are provided as access points on the inside surface to electrically connect the tamper-respondent sensor to the monitor circuit for monitoring, such as described herein.

Figure 6C:
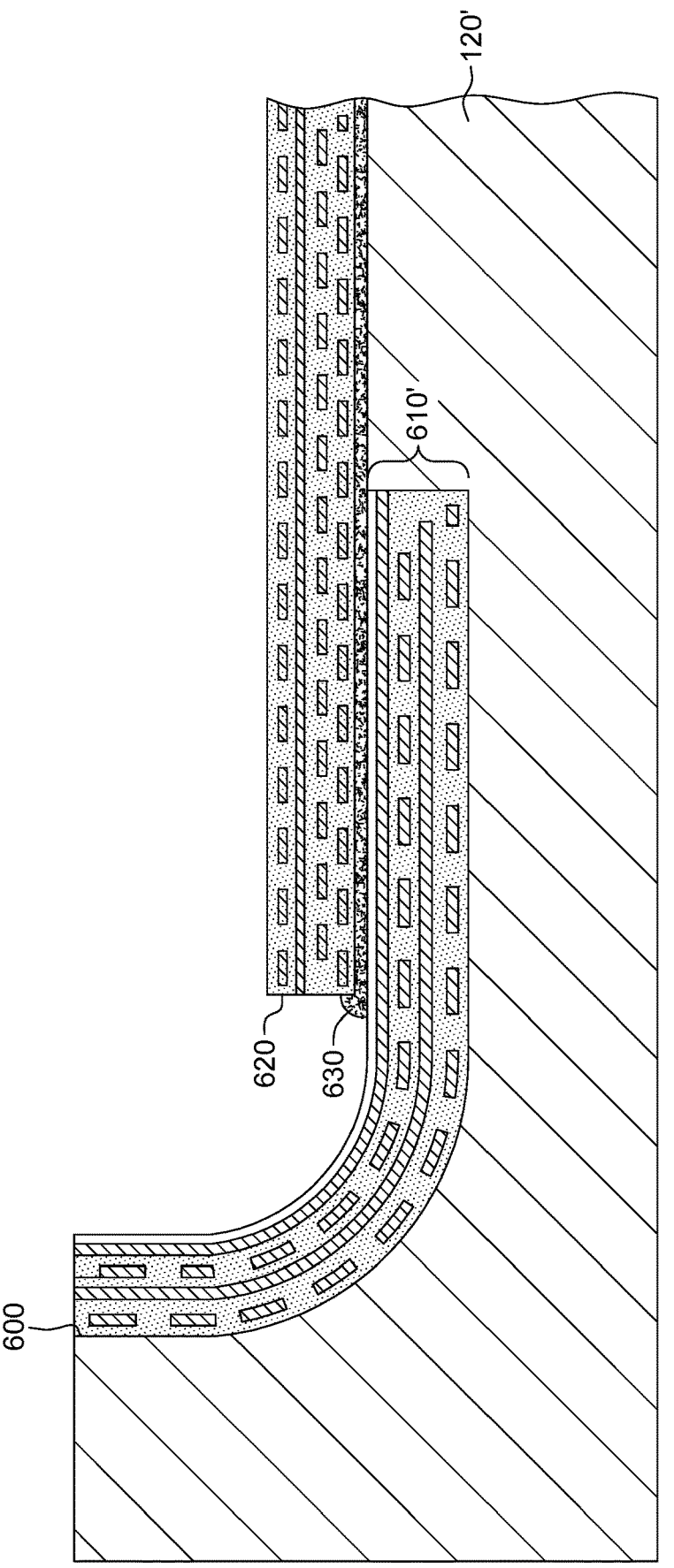
FIG. 6C depicts an embodiment of an in-situ formed tamper-respondent sensor on a surface of an enclosure to enclose one or more components in a secure volume, and another tamper-respondent sensor adhesively mounted over the in-situ formed tamper-respondent sensor and the surface of the enclosure, in accordance with one or more aspects of the present disclosure.

FIG. 6C depicts a further embodiment of an in-situ formed tamper-respondent sensor 610' on surface 600 of enclosure 120', which is combined with an adhesively-applied tamper-respondent sensor 620, in accordance with one or more aspects of the present disclosure. In this embodiment, in-situ formed multilayer security circuit 610' is depicted formed in a recessed region of inner surface 600 along the curved inner sidewall of enclosure 120'. Tamper-respondent sensor 620 is separately formed, such as the separately formed tamper-respondent sensors with multiple layers and one or more security circuits described above in connection with FIG. 2. Tamper-respondent sensor 620' is secured over in-situ formed multilayer security circuit 610' and over a main portion of inner surface 600 using an adhesive 630. In this manner, the in-situ formed tamper-respondent on the curved inner surface portion of the enclosure provides better fabrication yield by directly printing the security circuits onto the curved inner surface portion of the enclosure, while allowing adhesive securing of a separately formed tamper-respondent sensor onto the enclosure in a flat region less likely to negatively impact product yields.

Figure 7:
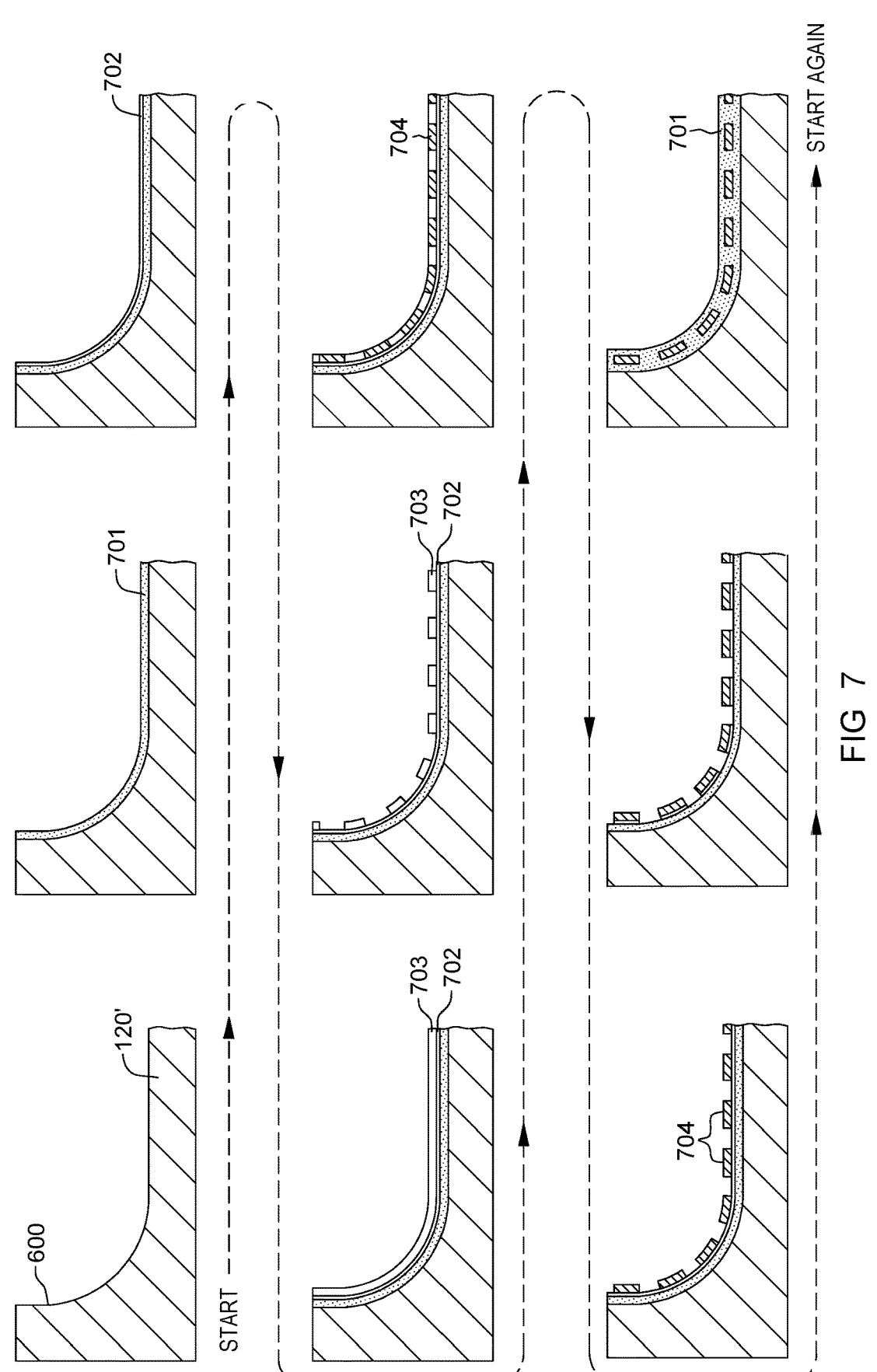
FIG. 7 depicts one embodiment of a process of fabricating in-situ a tamper-respondent sensor on a surface of an enclosure, in accordance with one or more aspects of the present disclosure.

FIG. 7 depicts a process embodiment for fabricating in-situ a tamper-respondent sensor on a surface of an enclosure, in accordance with one or more aspects of the present disclosure. As illustrated in FIG. 7, in one implementation, a security circuit layer, or tamper detection layer, of the tamper-respondent sensor is formed on inner surface 600 of enclosure 120' by applying a dry film 701, such as a clean polyimide film, onto the surface of the enclosure, and depositing a seed layer 702 onto the polyimide film. For instance, in one embodiment, a metal seed layer is deposited onto the polyimide film. In one embodiment, the metal seed layer can be, for instance, a titanium layer followed by a copper layer. As one example, the titanium layer can be approximately 300 angstroms thick, followed by an approximate 2000 angstrom thick copper layer. A photoresist material 703 is provided by, for instance, spin-coating a liquid resist or laminating a dry film resist onto the metal seed layer 702. Laser-direct writing or patterning of the photoresist is used to facilitate forming the respective random security circuit pattern, in accordance with one or more aspects disclosed herein. The photoresist is developed and the generated random security circuit pattern is exposed on the underlying substrate layers using, for instance, ashing or reactive-ion etching (RIE) of the photoresist. The security circuit is formed by, for instance, plating a conductor 704, such as a copper material, on the exposed seed layer. The remaining photoresist is removed or stripped away, and the seed layer (or layers) is etched. For instance, in the example above, the titanium in the metal seed layer can be etched with EDTA-$H_2O_2$, and the copper in the metal seed layer can then be etched. As illustrated in FIG. 7, the noted steps can be repeated for each security layer of a multilayer security circuit, with (in one or more embodiments) each security circuit layer being fabricated using a respective random security circuit pattern generated in accordance with one or more aspects disclosed herein.

Figure 8A:
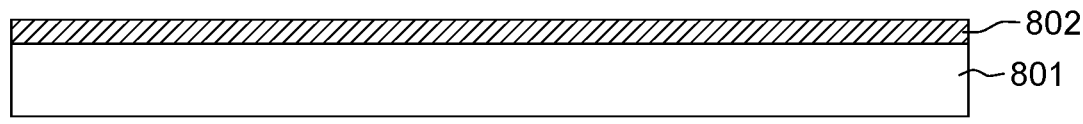
FIGS. 8A-8F depict another embodiment of a process of fabricating in-situ a tamper-respondent sensor on a surface of an enclosure, in accordance with one or more aspects of the present disclosure.
Figure 8B:
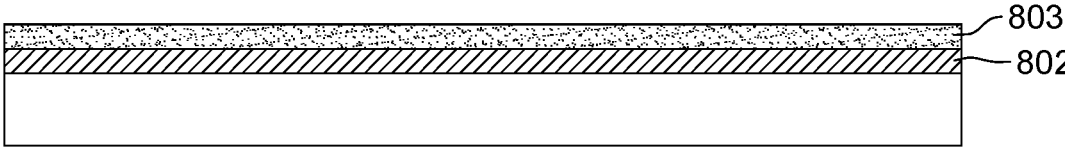
Figure 8C:
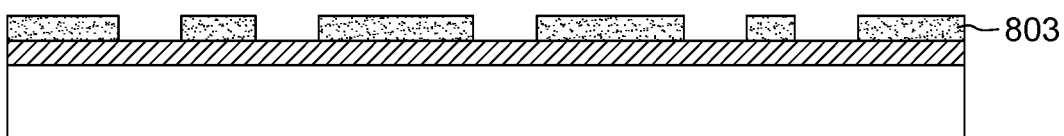
Figure 8D:
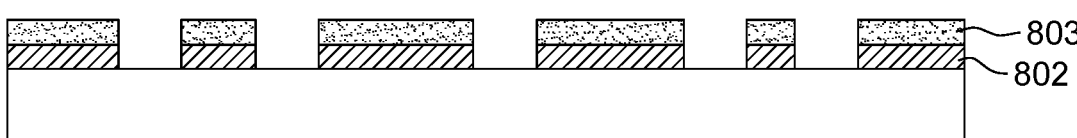
Figure 8E:
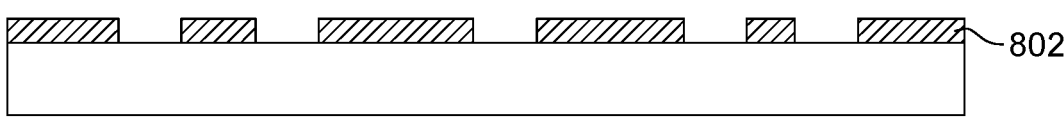
Figure 8F:
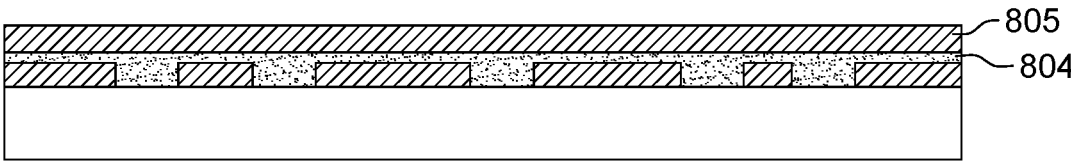

FIGS. 8A-8F depict another embodiment of in-situ forming of a tamper-respondent sensor on a surface of an enclosure, in accordance with one or more aspects disclosed herein. In this example, a film, such as a polyimide substrate 801, is directly applied to a surface of the enclosure, and a conductive film or layer 802, such as a copper film, is formed over the polyimide substrate 801. As illustrated in FIG. 8B, a photoresist layer 803 is spun-coated over conductive film 802 (in one embodiment). The photoresist is developed, as illustrated in FIG. 8C, using laser-patterning to, for instance, provide the random security circuit pattern (generated in accordance with one or more aspects disclosed herein) over the conductive film. As illustrated in FIG. 8D, the conductive film 802 left exposed by the patterned photoresist layer 803 is etched to form the security circuit in the conductive film, and the remaining photoresist layer is stripped away as illustrated in FIG. 8E, leaving the patterned random security circuit in the conductive film 802. A dielectric coating 804 is applied, such as a polyimide layer or substrate, followed by another layer of conductive film 805, such as another copper film, which is used to form a next layer of the multilayer security circuit, as described herein.

Figure 9A:
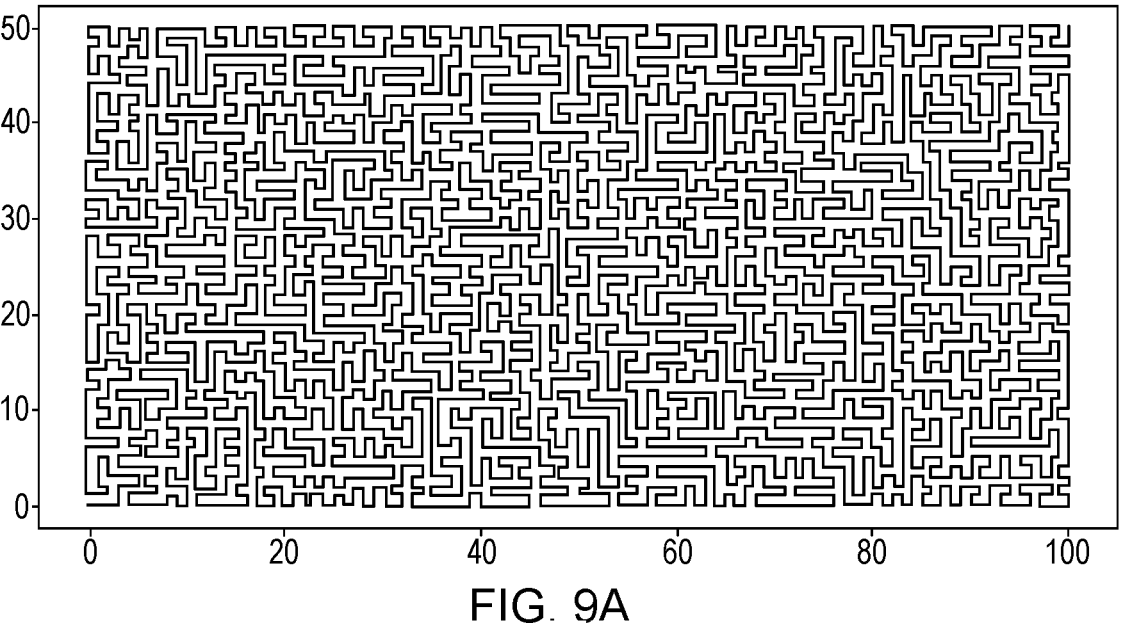
FIG. 9A depicts one embodiment of a random security circuit pattern established in accordance with one or more aspects of the present disclosure.
Figure 9B:
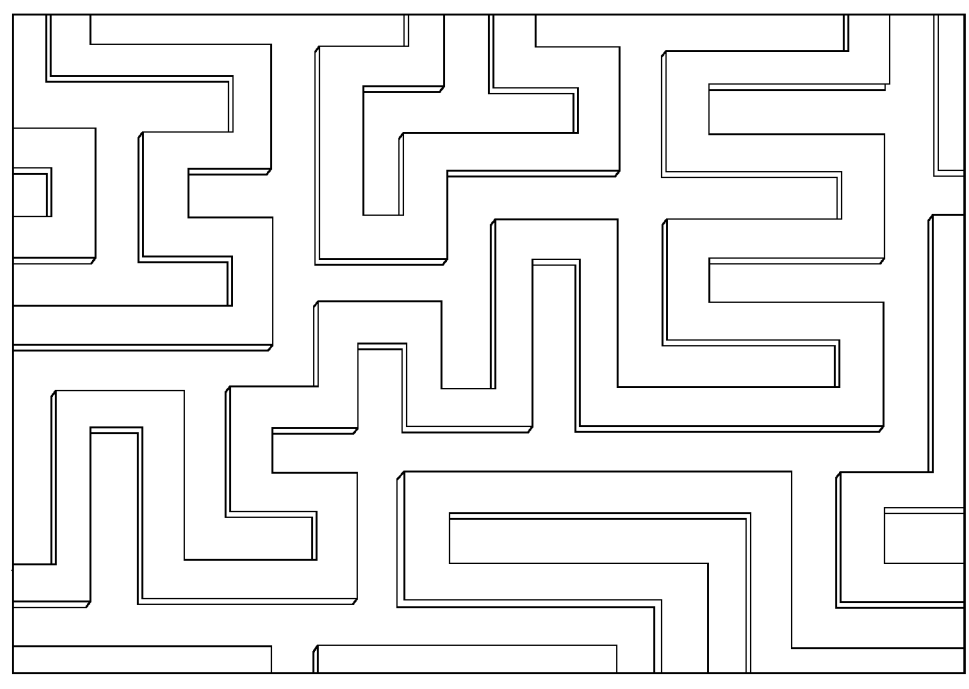
FIG. 9B is an enlarged partial depiction of a fabricated tamper-respondent sensor layer fabricated using a random security circuit pattern such as depicted in FIG. 9A, in accordance with one or more aspects of the present disclosure.

By way of example, FIG. 9A illustrates one embodiment of a random security circuit pattern generated such as disclosed herein, and FIG. 9B is an enlarged depiction of a portion the resultant security circuit fabricated using a random security circuit pattern such as depicted in FIG. 9A. Note that this is one example only of a random security circuit fabricated in-situ on the surface of an enclosure (including, for instance, over curved surfaces of the enclosure) to facilitate defining a secure volume, such as disclosed herein.

Figure 10:
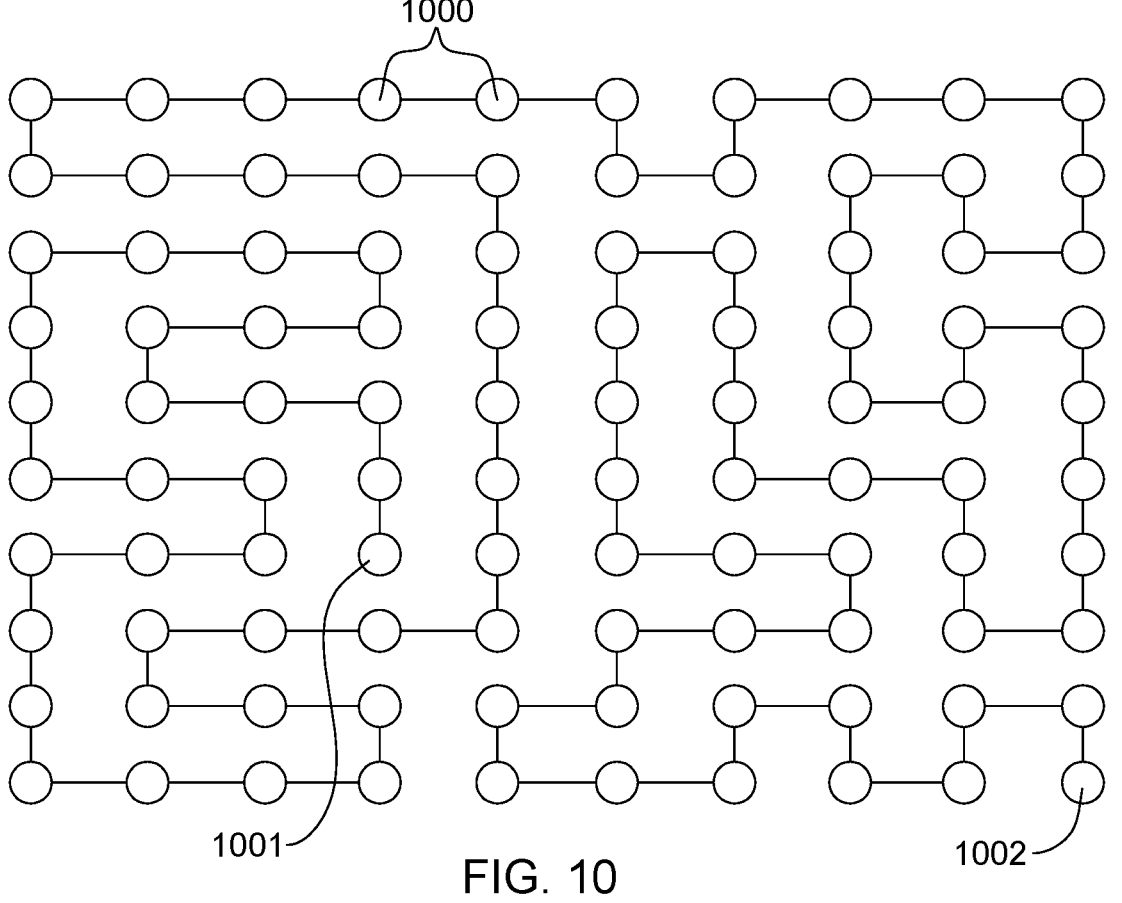
FIG. 10 depicts another embodiment of a random security circuit pattern for a specified area or area size, where the random pattern extends once through a plurality of nodes dispersed within the area using a randomization approach, in accordance with one or more aspects of the present disclosure.

FIGS. 10-14E depict further details of one or more embodiments of establishing a random security circuit pattern for fabricating a security circuit of a tamper-respondent sensor, in accordance with one or more aspects disclosed herein. As illustrated in FIG. 10, in one embodiment, a plurality of nodes 1000 are uniformly dispersed across a specified area or area size for the tamper-respondent sensor. In one or more implementations, the patterning is to cover a specified surface, such as an inner surface of an enclosure, with no intersection of the trace, and no islands within the area. This is a Hamiltonian path problem, and a self-avoiding walk sequence can be used in two dimensions between an input node 1001 and an output node 1002 of the plurality of nodes 1000 in generating the trace pattern. As understood, the Hamiltonian path, or trace path, is a path in a directed or undirected graph that visits each node exactly once, and there is no analytical solution to the Hamiltonian path problem. Algorithms do exist to generate Hamiltonian paths for a given lattice. Most approaches involve a large quantity of random numbers, m×n, for the algorithm practiced, where m, n are the number of vertices or nodes, which ensures in practice that each security circuit or security circuit layer of the tamper-respondent sensor is different from the others. The computational cost of generating Hamiltonian paths is very low, which makes possible a streamlined implementation of the processing disclosed herein.

Figure 11:
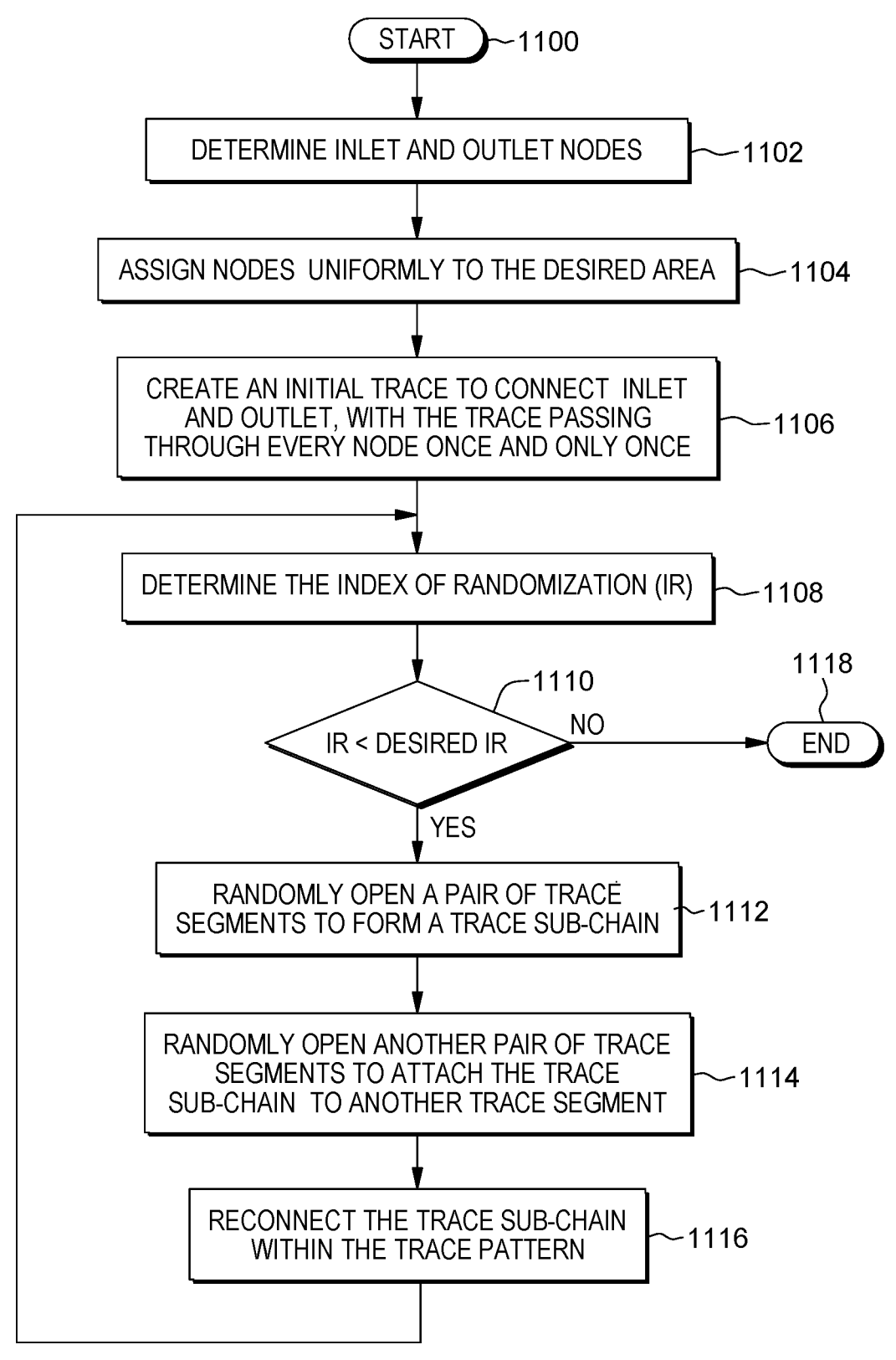
FIG. 11 depicts one embodiment of a workflow illustrating certain aspects of one or more embodiments of the present disclosure.

FIG. 11 depicts one embodiment of a workflow illustrating certain aspects of one or more embodiments of the present disclosure. As illustrated, the workflow starts 1100 with selecting, or determining, inlet and outlet nodes of a plurality of nodes dispersed within an area size for the security circuit of the tamper-respondent sensor 1102. Depending on the implementation, the location of the inlet and outlet nodes can be specified, or randomly selected. Nodes are assigned uniformly to the specified area 1104. The nodes can be orthogonal, but other patterns can also be used. An initial trace, such as an initial serpentine trace, is used to connect the inlet and outlet nodes, with the serpentine passing through each node once and only once 1106. An index of randomization (IR) 1108 is determined for the current trace, and processing ascertains whether the determined index of randomization is less than a desired index of randomization 1110. If "no", then processing is complete 1118 in the illustrated workflow. Assuming that the current trace has an index of randomization less than the desired index of randomization, then processing randomly opens (or cuts) adjacent trace segments in the trace pattern to produce a trace sub-chain unconnected to either the input node or the output node 1112. Additionally, another pair of adjacent trace segments of the trace pattern, including a trace segment of the trace sub-chain, are randomly opened (or cut) 1114. The trace sub-chain is then reconnected 1116 to the balance of the current trace by adding connecting trace segments between the opened pair of adjacent trace segments and connecting trace segments between the other opened pair of trace segments to facilitate forming a randomly modified trace pattern, for which the index randomization is then determined 1108. The process repeats until, for instance, the associated index of randomization is at or above the desired index of randomization 1110 for the random security circuit pattern.

Figure 12B:
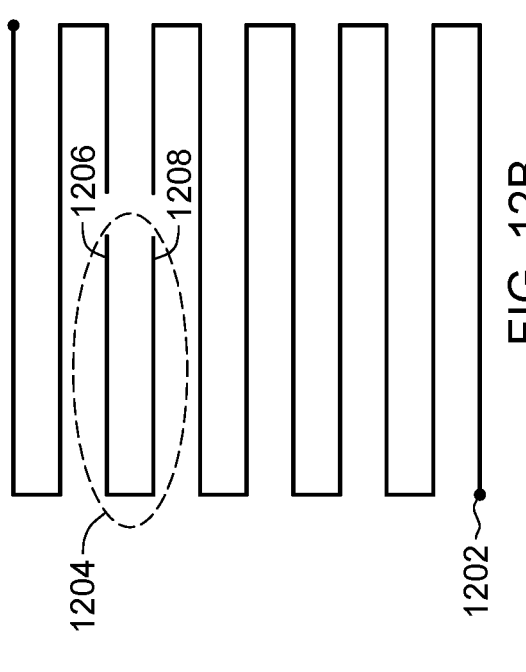
FIGS. 12A-12D illustrate an example of pattern generation using the workflow of FIG. 11, in accordance with one or more aspects of the present disclosure.
Figure 12D:
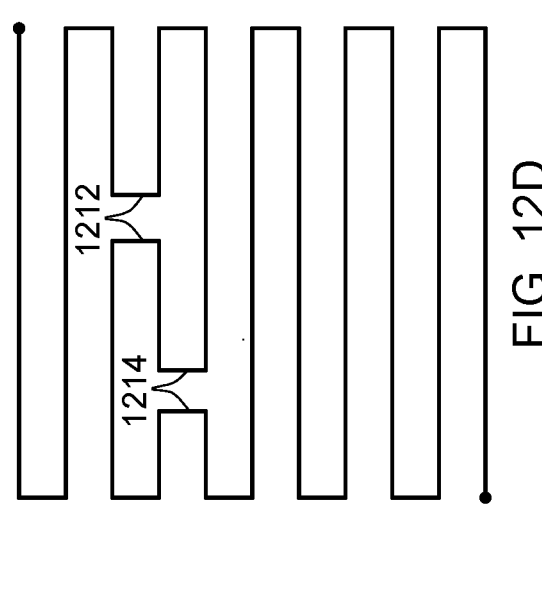
Figure 12A:
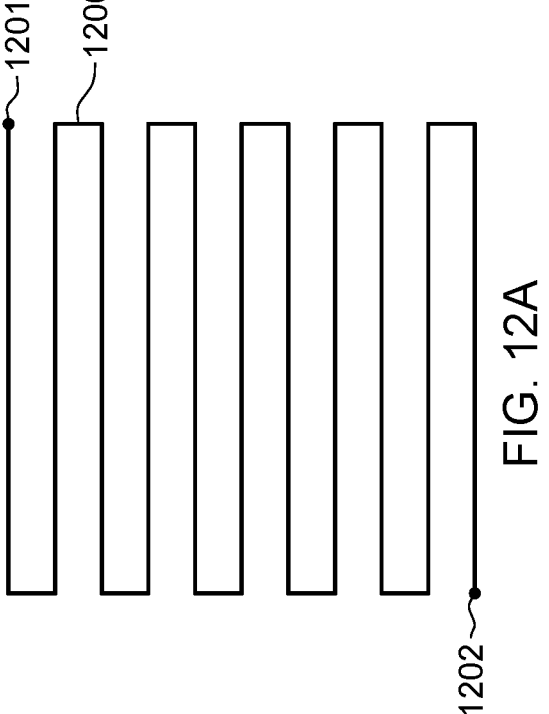
Figure 12C:
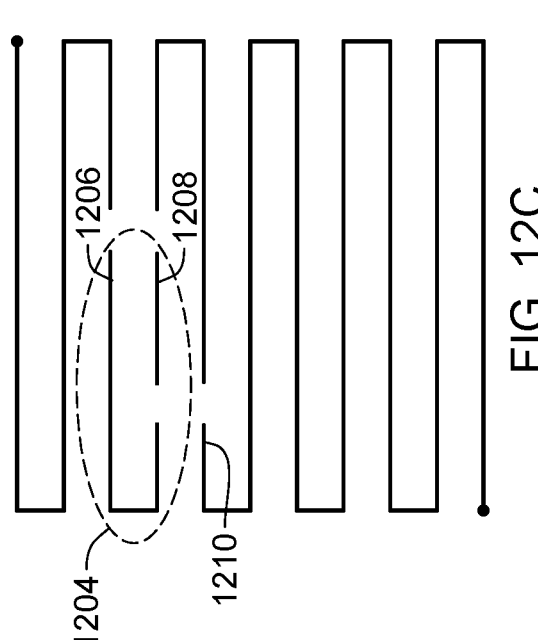

FIGS. 12A-12D illustrate one example of the workflow of FIG. 11. In FIG. 12A, inlet and outlet nodes 1201, 1202 have been assigned, and an initial trace 1200, such as a simple serpentine trace, has been patterned connecting the inlet and outlet nodes, with the trace passing through every node in between once and only once. In FIG. 12B, a pair of adjacent trace segments 1206, 1208 of the trace pattern have been randomly selected and opened (or cut) to produce a trace sub-chain 1204 unconnected to either input node 1201 or output node 1202. In accordance with the workflow, another pair of adjacent trace segments 1208, 1210 are randomly selected and opened (or cut) as well, with the other pair of adjacent trace segments 1208, 1210 including a trace segment 1208 of the trace sub-chain 1204, as illustrated in FIG. 12C. The trace sub-chain is then reconnected by adding connecting trace segments 1212 between the opened pair of adjacent trace segments 1206, 1208, and adding connecting trace segments 1214 between the other opened pair of trace segments 1208, 1210, to facilitate forming the randomly modified trace pattern, as illustrated in FIG. 12D.

As noted, the process continues until the randomly modified trace pattern has a desired randomization index relative to the specified randomization threshold. In one embodiment, the higher the randomization threshold, the greater the amount of randomization required to meet or exceed the threshold. One approach for ascertaining a randomization index or randomization metric is to quantify entropy. Entropy is a measure of a number of potential states or micro-states of a system. In classic statistical thermodynamics, the entropy is defined as:

$$S = k_B \ln \Omega$$

where:
  $k_B$=Boltzmann's constant, and
  $\omega$=the number of microstates consistent with the given macrostate.

Figure 13:
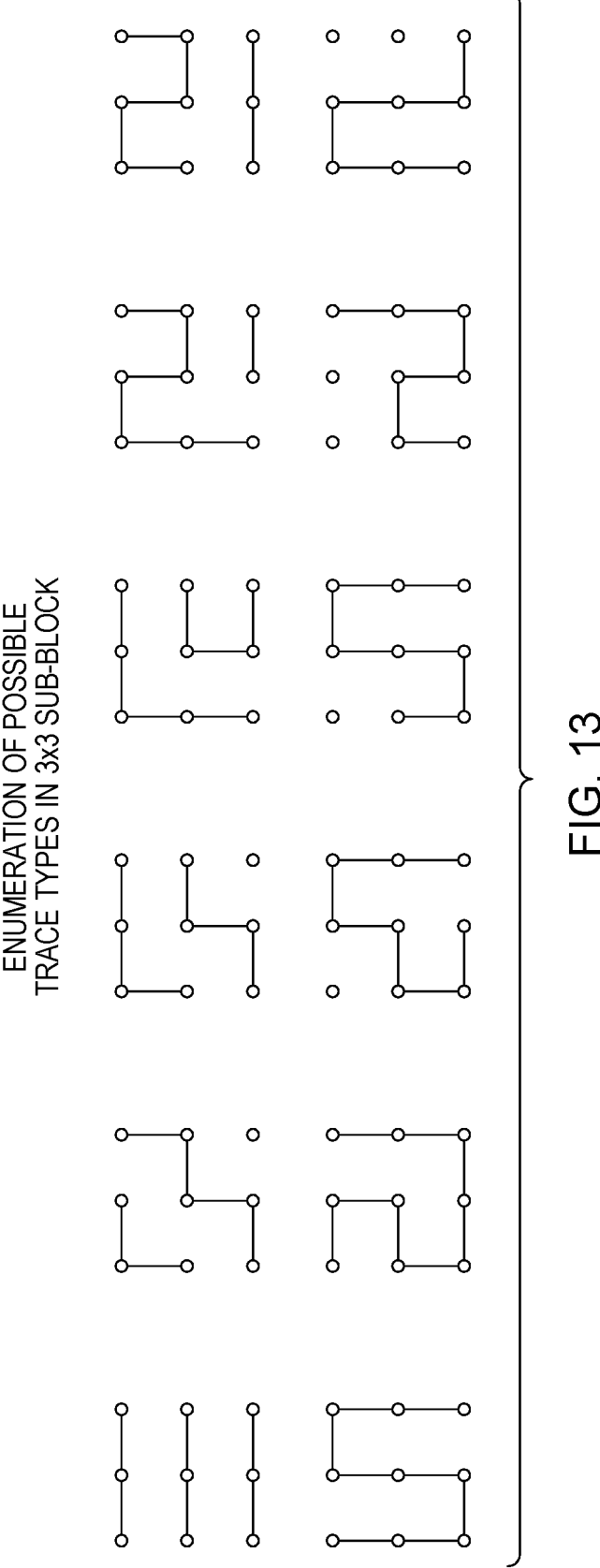
FIG. 13 illustrates exemplary sub-block trace patterns for a 3× 3 sub-block of nodes for use in determining an index of randomization of a generated trace pattern, in accordance with one or more aspects of the present disclosure.
Figure 14E:
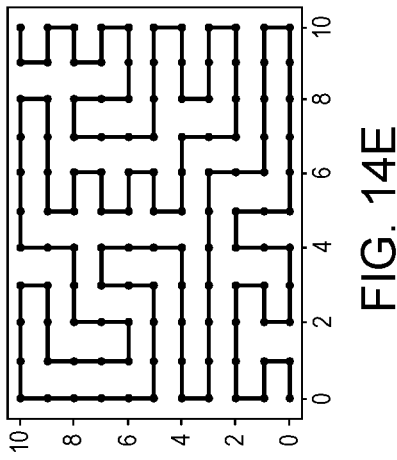
FIGS. 14A-14E illustrate different random security circuit patterns generated from an initial trace pattern using the workflow of FIG. 11, in accordance with one or more aspects of the present disclosure.
Figure 14B:
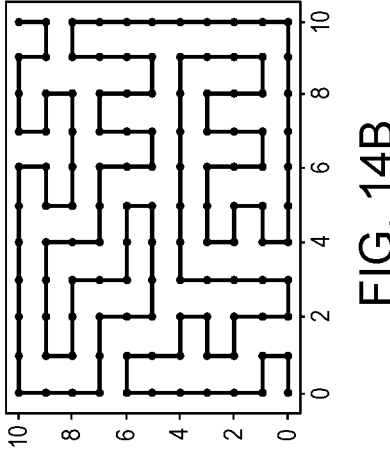
Figure 14D:
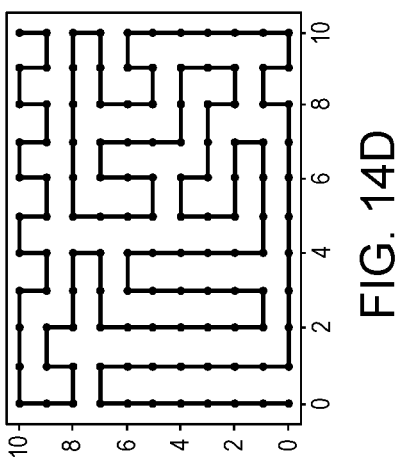
Figure 14A:
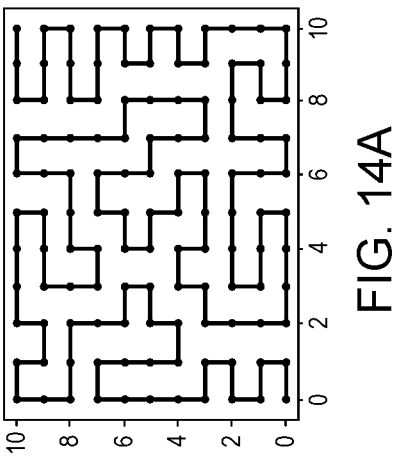
Figure 14C:
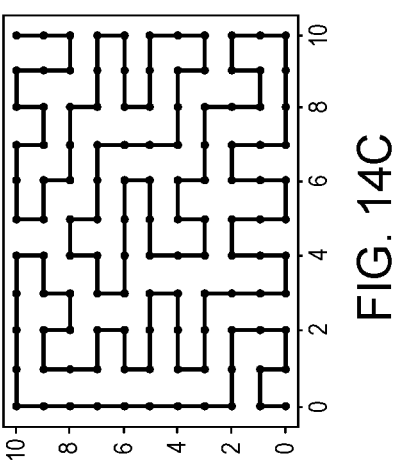

One embodiment of this is depicted in FIG. 13, where exemplary sub-blocks of possible trace types are illustrated for a 3× 3 node sub-block of the plurality of nodes for a specified area. In one embodiment, the greater the number of different sub-block trace types within the randomly modified trace pattern extending through the plurality of nodes dispersed within the specified area, the greater the entropy of the random pattern, and thus, the higher the randomization index.

In one embodiment, determining randomization index for a randomly modified trace pattern can include determining, for each of i×i sub-block sizes, a number $N_i$ of different sub-block trace types within the randomly modified trace pattern extending through the plurality of nodes dispersed within the area, where i≥2, and determining, for each of the i×i sub-block sizes, a maximum possible number $P_i$ of different sub-block trace types for the randomly modified trace pattern extending through the plurality of nodes dispersed within the area. An entropy value can be obtained for the randomly modified trace pattern using the determined number $N_i$ of different sub-block trace types within the randomly modified trace pattern, and the maximum possible number $P_i$ of different sub-block trace types within the randomly modified trace pattern, where the randomization index is or includes the entropy value. In one specific example, ascertaining the entropy value can include determining:

$$S = \sum_{i=2}^{n} N_i / \sum_{i=2}^{n} P_i$$

where: S=the entropy value; i=a size of the i×i sub-block; $N_i$=number of different sub-block trace types within a particular i×i sub-block of the randomly modified trace pattern extending through the plurality of nodes dispersed within the specified area; and $P_i$=maximum possible number of different sub-block types within the particular i×i sub-block of the randomly modified trace pattern extending through the plurality of nodes dispersed within the specified area. Those skilled in the art will note that an ordered system includes only a small fraction of possible sub-block types, and therefore, has a small S, while a random system will have a larger S. For instance, in one or more implementations, the randomization threshold could be 0.75 or higher on a scale of 0 to 1.

By way of further example, FIGS. 14A-14E illustrate different random security circuit patterns generated, for instance, from an initial trace pattern (such as the initial trace pattern of FIG. 12A), in accordance with one or more aspects of the present disclosure. These figures illustrate different random security circuit patterns obtained using the workflow of FIG. 11, after a number of iterations from the starting trace pattern or lattice. For instance, the number of iterations might be 100 iterations, and the figure illustrates that the resultant random security trace patterns using the process are random and different using the process described.

Based on establishing the random security circuit pattern, or patterns (in the case of a multilayer security circuit), the tamper-respondent sensor can be fabricated, for instance, as described herein with reference to FIGS. 6A-8F & 18.

Figure 15:
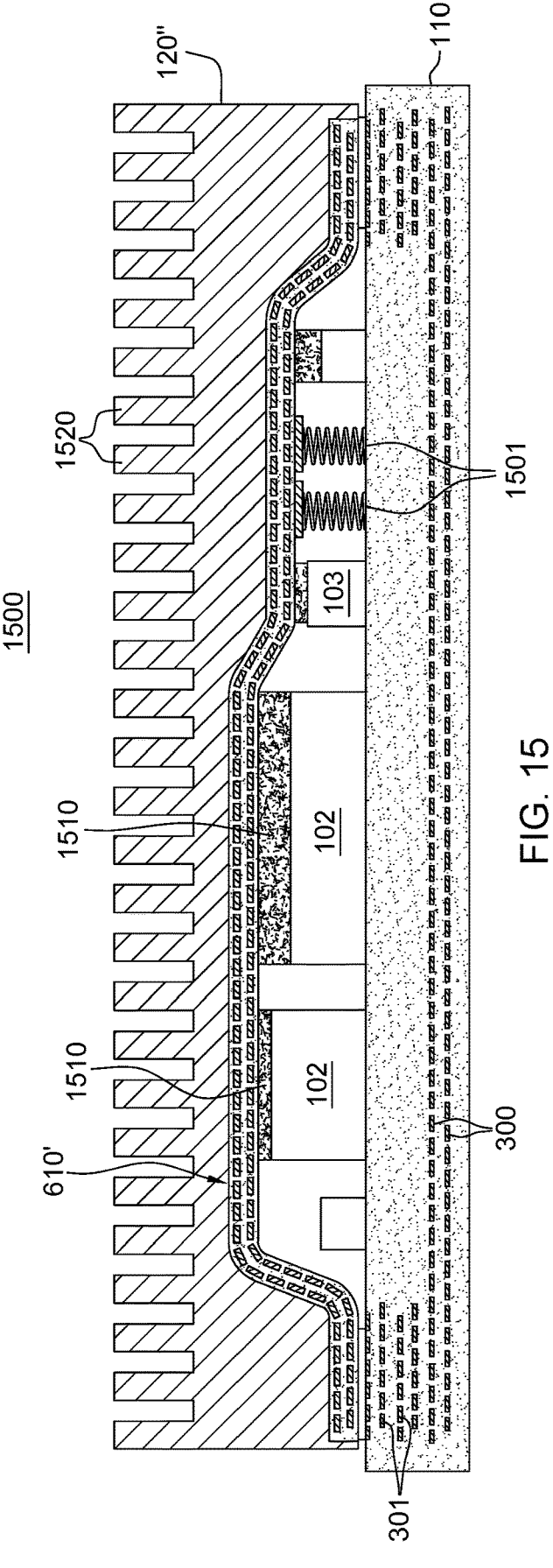
FIG. 15 is a partial cross-sectional elevational view of one embodiment of a tamper-respondent assembly with a tamper-respondent sensor formed in-situ on a surface of an enclosure mounted to one side of a substrate, such as one side of a circuit board, in accordance with one or more aspects of the present disclosure.
Figure 16:
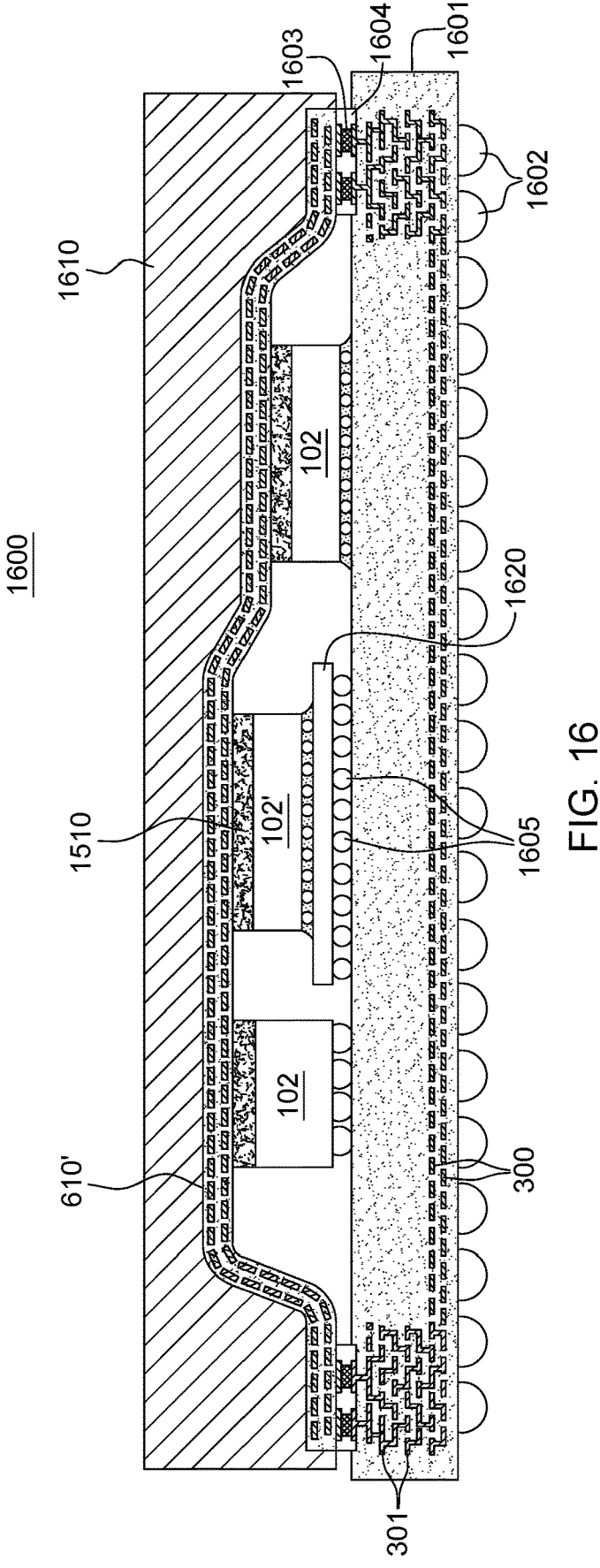
FIG. 16 is a partial cross-sectional elevational view of another embodiment of a tamper-respondent assembly with a tamper-respondent sensor formed in-situ on a surface of an enclosure mounted to one side of a substrate to be connected to a circuit board, in accordance with one or more aspects of the present disclosure.
Figure 17:
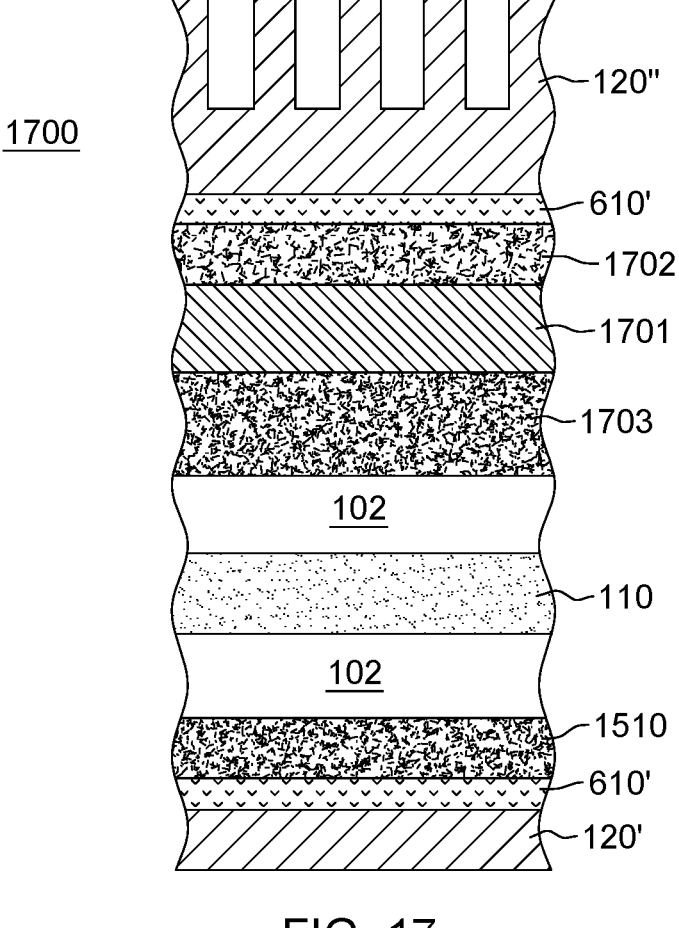
FIG. 17 is a schematic of another embodiment of a tamper-respondent assembly with tamper-respondent sensors formed in-situ on enclosures mounted to opposite sides of a supporting substrate, such as opposite sides of a multilayer circuit board, in accordance with one or more aspects of the present disclosure.

FIGS. 15-17 illustrate different embodiments of tamper-respondent assemblies fabricated, in accordance with one or more aspects disclosed. In each instance, the tamper-respondent sensor is fabricated, at least in part, as an in-situ tamper-respondent sensor on a surface of an enclosure, such as on an inner surface of the enclosure, to facilitate defining a respective secure volume accommodating one or more components disposed, for instance, on a substrate. As noted below, the substrate can be a multilayer circuit board substrate (FIGS. 15 & 17) or a multilayer, multi-chip module substrate (FIG. 16), in accordance with one or more aspects disclosed herein.

FIG. 15 depicts one embodiment of a tamper-proof electronic package or tamper-respondent assembly 1500, which includes one or more electronic components coupled to multilayer circuit board 110. An embedded tamper-respondent sensor is provided within multilayer circuit board 110 including, for instance, one or more tamper-detection frames 301 and one or more tamper-detection mat layer 300, such as described herein with reference to FIG. 3. An enclosure 120", such as a five-sided or pedestal-type enclosure, is mounted to multilayer circuit board 110 by, for instance, a respective structural adhesive material, to define a secure volume containing one or more electronic components 102, and a monitor circuit 103. One or more electrical connections 1501, such as one or more spring-type electrical connections, are provided to facilitate electrically connecting in-situ formed tamper-respondent sensor 610' to monitor circuit 103 for monitoring for an attempted intrusion into the secure volume. In the embodiment illustrated, components 102 are in contact with enclosure 120" via a respective thermal interface material 1510 selected to facilitate transfer of heat from components 102 to enclosure 120" through tamper-respondent sensor 610'. In one implementation, enclosure 120" can be a lid or cover formed of a thermally conductive material, such as a metal or metal composite material, and include one or more air-cooled fins 1520, such as one or more air-cooled pin fins, or other type of air-cooled heat sink or liquid-cooled heat sink.

Those skilled in the art will note that the tamper-respondent assembly embodiment of FIG. 15 includes a single-piece, tamper-sensing enclosure or cover, featuring one or more directly-formed or structured security circuits on the rigid enclosure substrate, such as a metal enclosure substrate. In one or more embodiments, the security circuit features multiple security circuit layers, such as two or more layers, formed directly on the surface of the enclosure substrate, such as the inner surface of the enclosure, including over curved inner surfaces of the enclosure, as illustrated in FIG. 15. Advantageously, in accordance with one or more aspects disclosed herein, the enclosure 120" and the security module circuit board 110 together form a physically secure, tamper-sensing and responding enclosure consistent with, for instance, a FIPS 104-3 Level-4 hardware security module. The enclosure can have either a uniform or non-uniform inward-facing cavity shape, where a non-uniform cavity shape can enable, in one or more aspects, package design optimization, for instance, to accommodate different component heights, optimize thermal bond lines for high-power components, design to connector working heights for, for instance, compression-style interconnects, etc.

FIG. 16 illustrates another implementation of a tamper-respondent assembly 1600, in accordance with one or more aspects disclosed herein. As illustrated, tamper-respondent assembly 1600 is similar in one or more aspects to tamper-respondent assembly 1500 described above. In particular, tamper-respondent assembly 1600 includes one or more electronic components 102, 102', coupled to a multilayer substrate 1601, similar to multilayer circuit board 110 described above. An embedded tamper-respondent sensor is provided within substrate 1601 and includes, for instance, one or more tamper detection frames 301 and one or more tamper-detection matt layers 300, such as described with reference to FIG. 3. An enclosure 1610, such as a five-sided or pedestal-type enclosure, is mounted to substrate 1601 by, for instance, a respective structural adhesive 1604 which, in this embodiment, can surround one or more electrical connections 1603 and/or tamper-detection frames positioned between an in-situ formed tamper-respondent sensor 610' on the inner surface of enclosure 1610 and multilayer substrate 1601. In one embodiment, a monitor circuit (not shown) is included within the secure volume between multilayer substrate 1601 and enclosure 1610. Note that in this embodiment, electronic component 102' is electrically connected to a carrier (or interposer) 1620, which electrically connects via connectors 1605 (e.g., a ball grid array) to multilayer substrate 1601. Further, in the embodiment of FIG. 16, multilayer substrate 1601 includes connectors 1602 (e.g., another ball grid array) on the underside for electrically connecting, for instance, to another substrate, such as another multilayer circuit board. In one embodiment, tamper-respondent assembly 1600 of FIG. 16 could reside within the secure volume defined by tamper-respondent assembly 1500 of FIG. 15, as one example only. In another embodiment, tamper-respondent assembly 1600 could reside on an unsecured multilayer circuit board, with tamper-respondent assembly 1600 providing tamper protection to the one or more electronic components 102, 102' in the assembly.

FIG. 17 illustrates a schematic of another embodiment of a tamper-respondent assembly 1700 with tamper-respondent sensors 610' formed in-situ on respective electronic enclosures 120', 120", mounted to opposite sides of a supporting substrate, such as multilayer circuit board 110, described herein. In this embodiment, one or more electronic components 102 are mounted to multilayer circuit board 110, with a thermal interface material 1510 thermally coupling the one or more electronic components 102 on the underside of multilayer circuit board 110 to in-situ formed tamper-respondent sensor 610' on the inner surface of enclosure 120'.

In the embodiment illustrated, a heat-spreader 1701, such as a metallic heat-spreader (e.g., a copper heat-spreader) is disposed within the secure volume above multilayer circuit board 110 to facilitate thermal transfer from one or more electronic components 102 on the upper side of the multilayer circuit board to enclosure 120", including through in-situ formed tamper-respondent sensor 610' on the inside surface of enclosure 120". In the embodiment illustrated, thermal interface materials 1702, 1703 are provided to facilitate thermal conduction from the one or more electronic components 102 on the upper side of multilayer circuit board 110 through heat-spreader 1701 to enclosure 120″. Note that with this structure, thermal benefit is achieved over prior approaches, where the tamper-respondent sensor is adhesively secured to the respective enclosure. In particular, thermal benefit is achieved by removing the structural epoxy adhesives previously used to secure the separately formed tamper-respondent sensors to the enclosures. These adhesives typically have poor thermal performance. In addition, reductions in thickness are possible by selective design of the conductor and dielectric layer thicknesses and widths of the sensors to the needs and requirements of the assembly, and for circuit performance, rather than being limited to prior tamper-respondent assembly methods and available material choices for conductors and dielectrics. Computational fluid dynamics modeling demonstrates the thermal benefits enabled by the in-situ fabrication approaches disclosed herein, where significant temperature reductions and/or increases in supportable power are provided, thereby enabling designs that may not be supportable using conventional assembly methods, depending on the thermal requirements.

Figure 18:
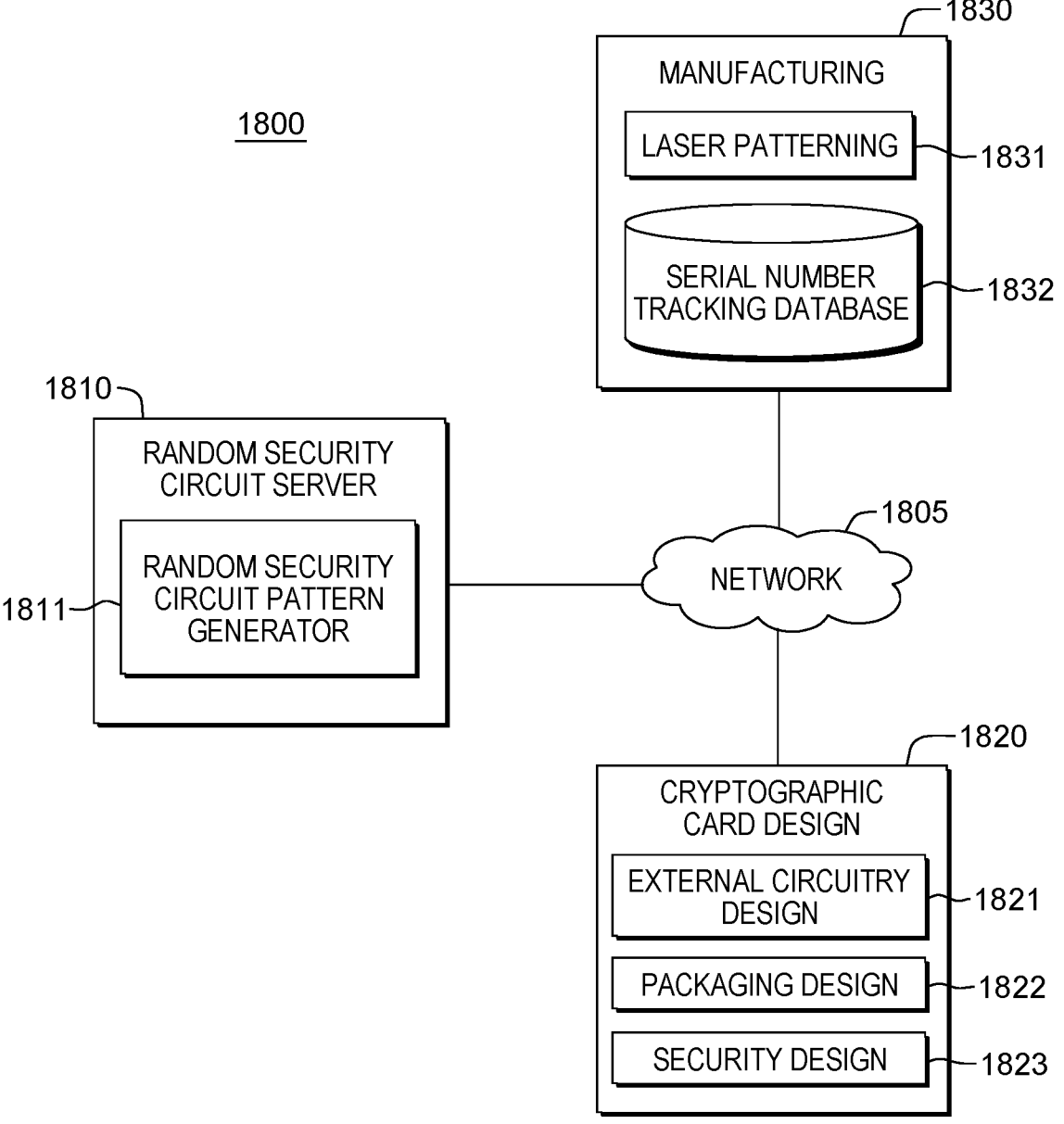
FIG. 18 depicts one embodiment of a system implementing one or more aspects of an embodiment of the present disclosure.

FIG. 18 depicts one embodiment of a system, generally denoted 1800, for fabricating tamper-respondent assemblies, and in particular, for generating random security circuit patterns, and tamper-respondent sensors of tamper-respondent assemblies, using processing such as described herein. Note in this regard that the illustrated embodiment is described herein by way of example only, and not by way of limitation. The illustrative embodiment can be used in conjunction with other comparable or similarly-purposed structures, systems, applications, or architectures. One or more aspects of an illustrative embodiment can be implemented in software, hardware, or a combination thereof.

As illustrated, system 1800 can include multiple computing environments including, for instance, a random security circuit system 1810 (or server), a cryptographic card design system 1820, and a manufacturing system 1830, by way of example only. As illustrated, random security circuit system 1810, cryptographic card design system 1820, and manufacturing system 1830, can communicate across one or more networks 1805. By way of example, network(s) 1805 can be, for instance, a telecommunications network, a local-area network (LAN), a wide-area network (WAN), such as the Internet, or a combination thereof, and can include wired, wireless, fiber-optic connections, etc. The network can include one or more wired and/or wireless networks that are capable of receiving and transmitting data, including data packets, with associated class of service profiles, such as described herein.

In one or more embodiments, one or more of the systems include program code, as referred to in this application, which can include software and/or hardware. For example, program code in certain embodiments of the present disclosure can include fixed function hardware, while other embodiments can utilize a software-based implementation of the functionality described. Certain embodiments can combine both types of program code.

In one or more embodiments, random security circuit system 1810 can include certain aspects of an embodiment of the present disclosure. Random security circuit system 1810 includes, in one embodiment, one or more computing resources that execute program code that implements a random security circuit pattern generator 1811, such as described herein.

In one or more implementations, the computing resources of random security circuit system 1810 house and/or execute program code configured to perform methods in accordance with one or more aspects of the present disclosure. By way of example, the computing resource(s) can be a server or other computing-system-implemented resource(s). Further, for illustrative purposes only, random security circuit system 1810 is illustrated as being a single computing resource. This is a non-limiting example of an implementation. In one or more other implementations, the computing resource(s), by which one or more aspects of the processing described herein (including any machine learning processing) are implemented, could, at least in part, be implemented in multiple separate computing resources or systems, such as one or more computing resources of a cloud-hosting environment, by way of example.

Briefly described, in one embodiment, the computing resource(s) of random security circuit system 1810 can include one or more processors, for instance, central processing units (CPUs). Also, the processor(s) can include functional components used in the integration of program code, such as functional components to fetch program code from locations, such as cache or main memory, decode program code, and execute program code, access memory for instruction execution, and write results of the executed instructions or code. The processor(s) can also include a register(s) to be used by one or more of the functional components. In one or more embodiments, the computing resource(s) can include memory, input/output, a network interface, and storage, which can include and/or access, one or more other computing resources and/or databases, as required to implement processing such as described herein. The components of the respective computing resource(s) can be coupled to each other via one or more buses and/or other connections. Bus connections can be one or more of any of several types of bus structures, including a memory bus or a memory controller, a peripheral bus, an accelerated graphics port, and a processor or local bus, using any of a variety of architectures. By way of example, but not limitation, such architectures can include the Industry Standard Architecture (ISA), the Micro-Channel Architecture (MCA), the Enhanced ISA (EISA), the Video Electronic Standard Association (VESA), local bus, and Peripheral Component Interconnect (PCI). Examples of a computing resource(s) or computer system(s) which can implement one or more aspects disclosed herein are described further below with reference to FIGS. 19-21.

As illustrated in FIG. 18, the circuit board design, such as a cryptographic card design 1820, can include circuitry design 1821, packaging design 1822, and security design 1823, for the printed circuit. In one embodiment, circuitry design 1821 would be the functional circuitry that performs the encryption, where the tamper-respondent sensor containing the random security circuit is attached to the circuit board, such as to the external circuitry, for security. Packaging design 1822 includes the mechanical aspects of the design, such as the size of the circuit board (e.g., cryptographic card), component size (such as the height of any heat sink), adequate cooling, ensuring compliance standards are met, etc. The security design 1823 for the printed circuit board can include additional security, such as the provision of an x-ray sensor on the cryptographic card to ensure that a tamper event could not easily scan and see the randomly-generated circuitry pattern(s). The circuitry design would monitor the sensor(s) and delete security keys if x-rays are detected. Further, in one or more embodiments, lead shielding, such as a lead enclosure, can be utilized around the tamper-respondent sensor with the randomly-generated security circuit pattern, such that any tamper event could not easily scan and see the randomly-generated security circuit(s).

As indicated above, manufacturing system 1830 can use, in one embodiment, laser-patterning 1831 to fabricate, for instance, a tamper-respondent sensor such as described herein. In one embodiment, serial number tracking of the completed sensor and/or assembly can also be provided within an associated database 1832, if desired.

One or more aspects of the present disclosure are incorporated in, performed and/or used by a computing environment. As examples, the computing environment can be of various architectures and of various types, including, but not limited to: personal computing, client-server, distributed, virtual, emulated, partitioned, non-partitioned, cloud-based, quantum, grid, time-sharing, clustered, peer-to-peer, mobile, having one node or multiple nodes, having one processor or multiple processors, and/or any other type of environment and/or configuration, etc., that is capable of executing a process (or multiple processes) that, e.g., perform self-tuning merged code test processing, such as disclosed herein. Aspects of the present disclosure are not limited to a particular architecture or environment.

Prior to further describing detailed embodiments of the present disclosure, an example of a computing environment to include and/or use one or more aspects of the present disclosure is discussed below with reference to FIG. 19.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1900 contains an example of an environment for the execution of at least some of the computer code involved in performing the inventive methods, such as random security circuit pattern generation module block 1950. In addition to block 1950, computing environment 1900 includes, for example, computer 1901, wide area network (WAN) 1902, end user device (EUD) 1903, remote server 1904, public cloud 1905, and private cloud 1906. In this embodiment, computer 1901 includes processor set 1910 (including processing circuitry 1920 and cache 1921), communication fabric 1911, volatile memory 1912, persistent storage 1913 (including operating system 1922 and block 1950, as identified above), peripheral device set 1914 (including user interface (UI) device set 1923, storage 1924, and Internet of Things (IoT) sensor set 1925), and network module 1915. Remote server 1904 includes remote database 1930. Public cloud 1905 includes gateway 1940, cloud orchestration module 1941, host physical machine set 1942, virtual machine set 1943, and container set 1944.

Computer 1901 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1930. As is well understood in the art of computer technology, and depending upon the technology, performance of a computer-implemented method may be distributed among multiple computers and/or between multiple locations. On the other hand, in this presentation of computing environment 1900, detailed discussion is focused on a single computer, specifically computer 1901, to keep the presentation as simple as possible. Computer 1901 may be located in a cloud, even though it is not shown in a cloud in FIG. 19. On the other hand, computer 1901 is not required to be in a cloud except to any extent as may be affirmatively indicated.

Processor set 1910 includes one, or more, computer processors of any type now known or to be developed in the future. Processing circuitry 1920 may be distributed over multiple packages, for example, multiple, coordinated integrated circuit chips. Processing circuitry 1920 may implement multiple processor threads and/or multiple processor cores. Cache 1921 is memory that is located in the processor chip package(s) and is typically used for data or code that should be available for rapid access by the threads or cores running on processor set 1910. Cache memories are typically organized into multiple levels depending upon relative proximity to the processing circuitry. Alternatively, some, or all, of the cache for the processor set may be located "off chip." In some computing environments, processor set 1910 may be designed for working with qubits and performing quantum computing.

Computer readable program instructions are typically loaded onto computer 1901 to cause a series of operational steps to be performed by processor set 1910 of computer 1901 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1921 and the other storage media discussed below. The program instructions, and associated data, are accessed by processor set 1910 to control and direct performance of the inventive methods. In computing environment 1900, at least some of the instructions for performing the inventive methods may be stored in block 1950 in persistent storage 1913.

Communication fabric 1911 is the signal conduction paths that allow the various components of computer 1901 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1912 is any type of volatile memory now known or to be developed in the future. Examples include dynamic type random access memory (RAM) or static type RAM. Typically, the volatile memory is characterized by random access, but this is not required unless affirmatively indicated. In computer 1901, the volatile memory 1912 is located in a single package and is internal to computer 1901, but, alternatively or additionally, the volatile memory may be distributed over multiple packages and/or located externally with respect to computer 1901.

Persistent storage 1913 is any form of non-volatile storage for computers that is now known or to be developed in the future. The non-volatility of this storage means that the stored data is maintained regardless of whether power is being supplied to computer 1901 and/or directly to persistent storage 1913. Persistent storage 1913 may be a read only memory (ROM), but typically at least a portion of the persistent storage allows writing of data, deletion of data and re-writing of data. Some familiar forms of persistent storage include magnetic disks and solid state storage devices. Operating system 1922 may take several forms, such as various known proprietary operating systems or open source Portable Operating System Interface type operating systems that employ a kernel. The code included in block 1950 typically includes at least some of the computer code involved in performing the inventive methods.

Peripheral device set 1914 includes the set of peripheral devices of computer 1901. Data communication connections between the peripheral devices and the other components of computer 1901 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1923 may include components such as a display screen, speaker, microphone, wearable devices (such as goggles and smart watches), keyboard, mouse, printer, touchpad, game controllers, and haptic devices. Storage 1924 is external storage, such as an external hard drive, or insertable storage, such as an SD card. Storage 1924 may be persistent and/or volatile. In some embodiments, storage 1924 may take the form of a quantum computing storage device for storing data in the form of qubits. In embodiments where computer 1901 is required to have a large amount of storage (for example, where computer 1901 locally stores and manages a large database) then this storage may be provided by peripheral storage devices designed for storing very large amounts of data, such as a storage area network (SAN) that is shared by multiple, geographically distributed computers. IoT sensor set 1925 is made up of sensors that can be used in Internet of Things applications. For example, one sensor may be a thermometer and another sensor may be a motion detector.

Network module 1915 is the collection of computer software, hardware, and firmware that allows computer 1901 to communicate with other computers through WAN 1902. Network module 1915 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1915 are performed on the same physical hardware device. In other embodiments (for example, embodiments that utilize software-defined networking (SDN)), the control functions and the forwarding functions of network module 1915 are performed on physically separate devices, such that the control functions manage several different network hardware devices. Computer readable program instructions for performing the inventive methods can typically be downloaded to computer 1901 from an external computer or external storage device through a network adapter card or network interface included in network module 1915.

WAN 1902 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End User Device (EUD) 1903 is any computer system that is used and controlled by an end user (for example, a customer of an enterprise that operates computer 1901), and may take any of the forms discussed above in connection with computer 1901. EUD 1903 typically receives helpful and useful data from the operations of computer 1901. For example, in a hypothetical case where computer 1901 is designed to provide a recommendation to an end user, this recommendation would typically be communicated from network module 1915 of computer 1901 through WAN 1902 to EUD 1903. In this way, EUD 1903 can display, or otherwise present, the recommendation to an end user. In some embodiments, EUD 1903 may be a client device, such as thin client, heavy client, mainframe computer, desktop computer and so on.

Remote server 1904 is any computer system that serves at least some data and/or functionality to computer 1901. Remote server 1904 may be controlled and used by the same entity that operates computer 1901. Remote server 1904 represents the machine(s) that collect and store helpful and useful data for use by other computers, such as computer 1901. For example, in a hypothetical case where computer 1901 is designed and programmed to provide a recommendation based on historical data, then this historical data may be provided to computer 1901 from remote database 1930 of remote server 1904.

Public cloud 1905 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 1905 is performed by the computer hardware and/or software of cloud orchestration module 1941. The computing resources provided by public cloud 1905 are typically implemented by virtual computing environments that run on various computers making up the computers of host physical machine set 1942, which is the universe of physical computers in and/or available to public cloud 1905. The virtual computing environments (VCEs) typically take the form of virtual machines from virtual machine set 1943 and/or containers from container set 1944. It is understood that these VCEs may be stored as images and may be transferred among and between the various physical machine hosts, either as images or after instantiation of the VCE. Cloud orchestration module 1941 manages the transfer and storage of images, deploys new instantiations of VCEs and manages active instantiations of VCE deployments. Gateway 1940 is the collection of computer software, hardware, and firmware that allows public cloud 1905 to communicate through WAN 1902.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1906 is similar to public cloud 1905, except that the computing resources are only available for use by a single enterprise. While private cloud 1906 is depicted as being in communication with WAN 1902, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1905 and private cloud 1906 are both part of a larger hybrid cloud.

The computing environment described above is only one example of a computing environment to incorporate, perform and/or use one or more aspects of the present disclosure. Other examples are possible. Further, in one or more embodiments, one or more of the components/modules of FIG. 19 need not be included in the computing environment and/or are not used for one or more aspects of the present disclosure. Further, in one or more embodiments, additional and/or other components/modules can be used. Other variations are possible.

Figure 20:
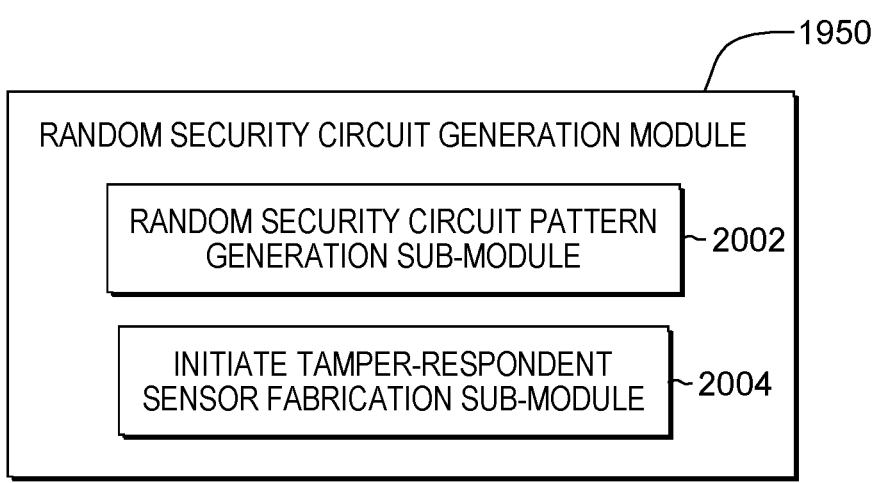
FIG. 20 depicts one embodiment of a computer program product with a random security circuit pattern generation module, in accordance with one or more aspects of the present disclosure.
Figure 21:
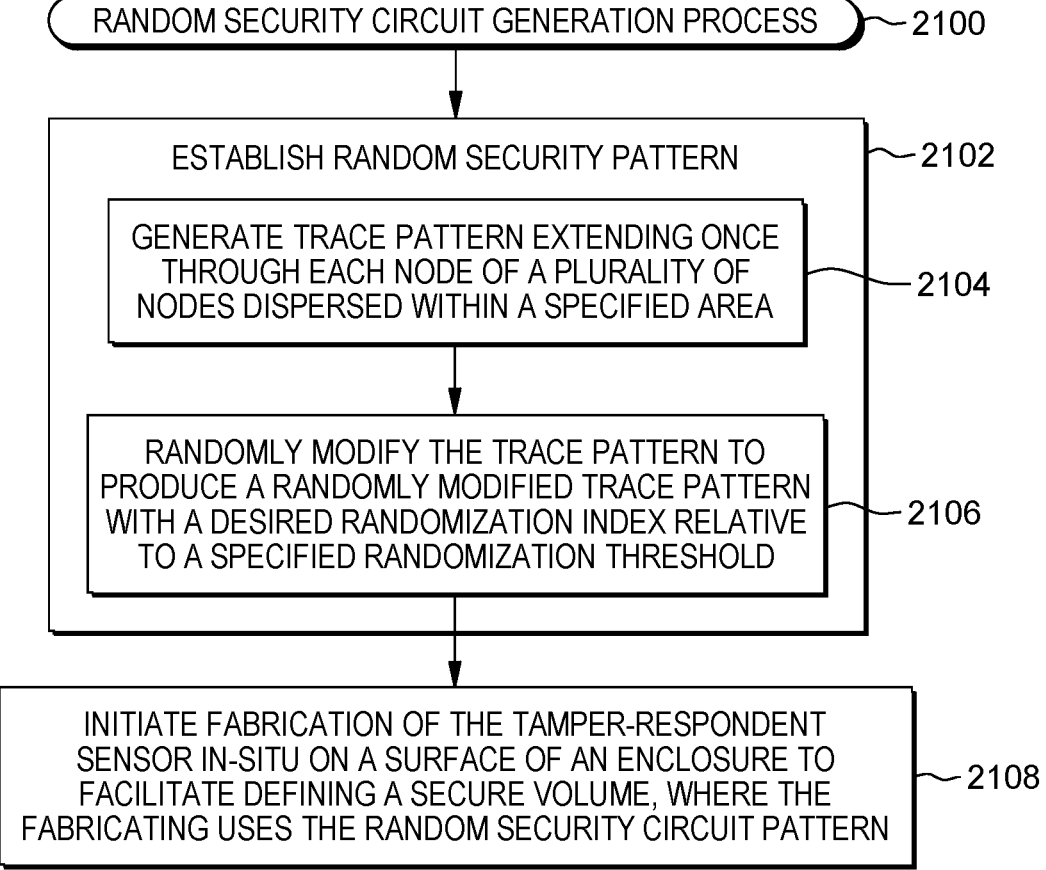
FIG. 21 depicts one embodiment of a random security circuit pattern generation process, in accordance with one or more aspects of the present disclosure.

By way of example, one or more embodiments of a random security circuit pattern generation module and workflow are described further with reference to FIGS. 20-21. FIG. 20 depicts one embodiment of random security circuit pattern generation module 1950 that includes code or instructions to perform a random security circuit pattern generation workflow, in accordance with one or more aspects of the present disclosure, and FIG. 21 depicts one embodiment of a random security circuit pattern generation workflow, in accordance with one or more aspects of the present disclosure.

Referring to FIGS. 19 & 20, random security circuit pattern generation module 1950 includes, in one example, various sub-modules used to perform processing, in accordance with one or more aspects of the present disclosure. The sub-modules are, e.g., computer-readable program code (e.g., instructions) and computer-readable media (e.g., persistent storge (e.g., persistent storage 1913, such as a disk) and/or a cache (e.g., cache 1921), as examples). The computer-readable media can be part of a computer program product and can be executed by and/or using one or more computers, such as computer(s) 1901; processors, such as a processor of processor set 1910; and/or processing circuitry, such as processing circuitry of processor set 1910, etc.

In the FIG. 20 embodiment, example sub-modules of random security circuit pattern generation module 1950 include, for instance, a random security circuit pattern generation sub-module 2002 to facilitate establishing a random security circuit pattern for fabricating a security circuit of a tamper-respondent sensor to enclose, at least in part, one or more components within a secure volume. As illustrated, random security circuit generation module 1950 further includes, in one embodiment, an initiate tamper-respondent sensor fabrication sub-module 2004 to fabricate the tamper-respondent sensor in-situ on a surface of an enclosure to facilitate defining the secure volume, where the fabricating uses the random security circuit pattern. Advantageously, the random security circuit generation module and process disclosed herein facilitates fabrication of enhanced, high-security structures using, for instance, greater randomization of the security circuit pattern and enhanced fabrication yield through in-situ fabrication of the tamper-respondent sensor on the surface of the enclosure to facilitate defining the secure volume. The random security circuit generation module and process disclosed provide a high-security structure that is less susceptible to reverse engineering or intrusion, and which provides enhanced thermal performance of the resultant tamper-respondent assembly using one or more in-situ formed tamper-respondent sensors, such as disclosed. Note that although various sub-modules are described, random security circuit generation processing such as disclosed herein can use, or include, addition, fewer, and/or different sub-modules. A particular sub-module can include additional code, including code of other sub-modules, or less code. Further, additional and/or other modules can be used. Many variations are possible.

In one or more embodiments, the sub-modules are used, in accordance with one or more aspects of the present disclosure, to perform random security circuit pattern generation processing. FIG. 21 depicts one example of a random security circuit pattern generation workflow, such as disclosed herein. The method is executed, in one or more examples, by a computer (e.g., computer 1901 (FIG. 19)), and/or a processor or processing circuitry (e.g., of processor set 1910 of FIG. 19). In one example, code or instructions implementing the method, are part of a module, such random security circuit pattern generation module 1950. In other examples, the code can be included in one or more other modules and/or in one or more sub-modules of the one or more other modules. Various options are available.

As one example, random security circuit pattern generation process 2100 executing on a computer (e.g., computer 1901 of FIG. 19), a processor (e.g., a processor of processor set 1910 of FIG. 19), and/or processing circuitry (e.g., processing circuitry of processor set 1910), establishes a random security circuit pattern 2102 for fabricating a security circuit of a tamper-respondent sensor to enclose, at least in part, one or more components within a secure volume. In the embodiment illustrated, establishing the random security circuit pattern 2102 includes generating a trace pattern extending once through nodes of the plurality of nodes dispersed within an area of the tamper-respondent sensor 2104. Establishing the random security pattern 2102 further includes randomly modifying the trace pattern to produce a randomly modified trace pattern with a desired randomization index relative to a specified randomization threshold 2106. As illustrated in FIG. 21, random security generation process 2100 further includes initiating fabrication of the tamper-respondent sensor in-situ on a surface of an enclosure to facilitate defining a secure volume, where the fabricating uses the established random security circuit pattern 2108.

The terminology used herein is for the purpose of describing particular embodiments only and is not intended to be limiting of the disclosure. As used herein, the singular forms "a", "and" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method comprising:
establishing a random security circuit pattern for fabricating a security circuit of a tamper-respondent sensor to enclose, at least in part, one or more components within a secure volume, the establishing comprising:
generating a trace pattern extending once through nodes of a plurality of nodes dispersed within an area of the tamper-respondent sensor; and
randomly modifying the trace pattern to produce a randomly modified trace pattern with a desired randomization index relative to a specified randomization threshold, and providing the randomly modified trace pattern as the random security circuit pattern; and
initiating fabricating of the tamper-respondent sensor in-situ on a surface of an enclosure to facilitate defining the secure volume, the fabricating using the random security circuit pattern.

2. The computer-implemented method of claim 1, wherein the security circuit is a multilayer security circuit, and the random security circuit pattern is used in fabricating one layer of the multilayer security circuit, and wherein the method further comprises establishing a respective random security circuit pattern for each layer of multiple layers of the multilayer security circuit, and the initiating fabricating comprises initiating in-situ fabricating of the multilayer security circuit using the respective random security circuit patterns for the multiple layers of the multilayer security circuit.

3. The computer-implemented method of claim 2, wherein the initiating fabricating comprises initiating direct plating of the multilayer security circuit on the surface of the enclosure using the respective random security circuit patterns for the multiple layers of the multilayer security circuit.

4. The computer-implemented method of claim 3, wherein the surface of the enclosure comprises a curved surface, and wherein the direct plating includes using laser-patterning in fabricating the multilayer security circuit on the surface of the enclosure using the respective random security circuit patterns.

5. The computer-implemented method of claim 1, wherein the trace pattern extends once through each node of the plurality of nodes between an input node and an output node, and wherein the randomly modifying comprises randomly modifying the trace pattern while ensuring that the randomly modified trace pattern extends once through the nodes of the plurality of nodes between the input and output nodes, and continuing to randomly modify the randomly modified trace pattern until the desired randomization index relative to the specified randomization threshold is reached.

6. The computer-implemented method of claim 1, wherein generating the trace pattern comprises:
dispersing the plurality of nodes uniformly within the area of the tamper-respondent sensor;
determining an input node and an output node of the plurality of nodes;
creating the trace pattern extending once through the nodes of the plurality of nodes dispersed uniformly within the area of the tamper-respondent sensor between the input and output nodes.

7. The computer-implemented method of claim 6, wherein creating the trace pattern extending once through the plurality of nodes within the area comprises creating the trace pattern as a serpentine trace pattern extending through the plurality of nodes within the area using a self-avoiding walk sequence.

8. The computer-implemented method of claim 6, further comprising determining the randomization index for the randomly modified trace pattern, the determining of the randomization index comprising:

determining, for each of i×i sub-block sizes, a number $N_i$ of different sub-block trace types within the randomly modified trace pattern extending through the plurality of nodes dispersed within the area, wherein i≥2;

determining, for each of the i×i sub-block sizes, a maximum possible number $P_i$ of different sub-block trace types within the randomly modified trace pattern extending through the plurality of nodes dispersed within the area; and ascertaining an entropy value for the randomly modified trace pattern using the number $N_i$ of different sub-block trace types within the randomly modified trace pattern, and the maximum possible number $P_i$ of different sub-block trace types within the randomly modified trace pattern, wherein the randomization index comprises the entropy value.

9. The computer-implemented method of claim 8, wherein ascertaining the entropy value comprises:

$$S = \sum_{i=2}^{n} N_i / \sum_{i=2}^{n} P_i$$

where:

S=the entropy value;

i=a size of the i×i sub-block;

$N_i$=number of different sub-block trace types within an i×i sub-block of the randomly modified trace pattern extending through the plurality of nodes dispersed within the specified area; and $P_i$=maximum possible number of different sub-block types within an i×i sub-block of the randomly modified trace pattern extending through the plurality of nodes dispersed within the specified area.

10. The computer-implemented method of claim 6, wherein randomly modifying the trace pattern to produce the randomly modified trace pattern includes:

randomly opening a pair of adjacent trace segments of the trace pattern to produce a trace sub-chain unconnected to one of the input and output nodes;

randomly opening another pair of adjacent trace segments of the trace pattern, the other pair of adjacent trace segments including a trace segment of the trace sub-chain; and reconnecting the trace sub-chain by adding trace segments connecting the opened pair of adjacent trace segments and adding trace segments connecting the other opened pair of trace segments to facilitate forming the randomly modified trace pattern.

11. A computer system comprising:

a memory; and at least one processor in communication with the memory, wherein the computer system is configured to perform a method, the method comprising:

establishing a random security circuit pattern for fabricating a security circuit of a tamper-respondent sensor to enclose, at least in part, one or more components within a secure volume, the establishing comprising:

generating a trace pattern extending once through nodes of a plurality of nodes dispersed within an area of the tamper-respondent sensor; and randomly modifying the trace pattern to produce a randomly modified trace pattern with a desired randomization index relative to a specified randomization threshold, and providing the randomly modified trace pattern as the random security circuit pattern; and initiating fabricating of the tamper-respondent sensor in-situ on a surface of an enclosure to facilitate defining the secure volume, the fabricating using the random security circuit pattern.

12. The computer system of claim 11, wherein the security circuit is a multilayer security circuit, and the random security circuit pattern is used in fabricating one layer of the multilayer security circuit, and wherein the method further comprises establishing a respective random security circuit pattern for each layer of multiple layers of the multilayer security circuit, and the initiating fabricating comprises initiating in-situ fabricating of the multilayer security circuit using the respective random security circuit patterns for the multiple layers of the multilayer security circuit.

13. The computer system of claim 11, wherein the trace pattern extends once through each node of the plurality of nodes between an input node and an output node, and wherein the randomly modifying comprises randomly modifying the trace pattern while ensuring that the randomly modified trace pattern extends once through the nodes of the plurality of nodes between the input and output nodes, and continuing to randomly modify the randomly modified trace pattern until the desired randomization index relative to the specified randomization threshold is reached.

14. The computer system of claim 11, wherein generating the trace pattern comprises:

dispersing the plurality of nodes uniformly within the area of the tamper-respondent sensor;

determining an input node and an output node of the plurality of nodes;

creating the trace pattern extending once through the nodes of the plurality of nodes dispersed uniformly within the area of the tamper-respondent sensor between the input and output nodes.

15. The computer system of claim 14, further comprising determining the randomization index for the randomly modified trace pattern, the determining of the randomization index comprising:

determining, for each of i×i sub-block sizes, a number $N_i$ of different sub-block trace types within the randomly modified trace pattern extending through the plurality of nodes dispersed within the area, wherein i≥2;

determining, for each of the i×i sub-block sizes, a maximum possible number $P_i$ of different sub-block trace types within the randomly modified trace pattern extending through the plurality of nodes dispersed within the area; and ascertaining an entropy value for the randomly modified trace pattern using the number $N_i$ of different sub-block trace types within the randomly modified trace pattern, and the maximum possible number $P_i$ of different sub-block trace types within the randomly modified trace pattern, wherein the randomization index comprises the entropy value.

16. The computer system of claim 14, wherein randomly modifying the trace pattern to produce the randomly modified trace pattern includes:

randomly opening a pair of adjacent trace segments of the trace pattern to produce a trace sub-chain unconnected to one of the input and output nodes;

randomly opening another pair of adjacent trace segments of the trace pattern, the other pair of adjacent trace segments including a trace segment of the trace sub-chain; and reconnecting the trace sub-chain by adding trace segments connecting the opened pair of adjacent trace segments and adding trace segments connecting the other opened pair of trace segments to facilitate forming the randomly modified trace pattern.

17. A computer program product comprising:

one or more computer readable storage media and program instructions collectively stored on the one or more computer readable storage media readable by at least one processor to:

establish a random security circuit pattern for fabricating a security circuit of a tamper-respondent sensor to enclose, at least in part, one or more components within a secure volume, the establishing comprising:

generating a trace pattern extending once through nodes of a plurality of nodes dispersed within an area of the tamper-respondent sensor; and randomly modifying the trace pattern to produce a randomly modified trace pattern with a desired randomization index relative to a specified randomization threshold, and providing the randomly modified trace pattern as the random security circuit pattern; and initiate fabricating of the tamper-respondent sensor in-situ on a surface of an enclosure to facilitate defining the secure volume, the fabricating using the random security circuit pattern.

18. The computer program product of claim 17, wherein generating the trace pattern comprises:

dispersing the plurality of nodes uniformly within the area of the tamper-respondent sensor;

determining an input node and an output node of the plurality of nodes;

creating the trace pattern extending once through the nodes of the plurality of nodes dispersed uniformly within the area of the tamper-respondent sensor between the input and output nodes.

19. The computer program product of claim 18, further comprising determining the randomization index for the randomly modified trace pattern, the determining of the randomization index comprising:

determining, for each of i×i sub-block sizes, a number $N_i$ of different sub-block trace types within the randomly modified trace pattern extending through the plurality of nodes dispersed within the area, wherein i≥2;

determining, for each of the i×i sub-block sizes, a maximum possible number $P_i$ of different sub-block trace types within the randomly modified trace pattern extending through the plurality of nodes dispersed within the area; and ascertaining an entropy value for the randomly modified trace pattern using the number $N_i$ of different sub-block trace types within the randomly modified trace pattern, and the maximum possible number $P_i$ of different sub-block trace types within the randomly modified trace pattern, wherein the randomization index comprises the entropy value.

20. The computer program product of claim 18, wherein randomly modifying the trace pattern to produce the randomly modified trace pattern includes:

randomly opening a pair of adjacent trace segments of the trace pattern to produce a trace sub-chain unconnected to one of the input and output nodes;

randomly opening another pair of adjacent trace segments of the trace pattern, the other pair of adjacent trace segments including a trace segment of the trace sub-chain; and reconnecting the trace sub-chain by adding trace segments connecting the opened pair of adjacent trace segments and adding trace segments connecting the other opened pair of trace segments to facilitate forming the randomly modified trace pattern.

* * * * *